US008041045B2

(12) United States Patent
Burwen

(10) Patent No.: US 8,041,045 B2
(45) Date of Patent: Oct. 18, 2011

(54) UNNATURAL REVERBERATION

(75) Inventor: Richard S. Burwen, Lexington, MA (US)

(73) Assignee: Richard S. Burwen, Lexington, MA (US)

( * ) Notice: Subject to any disclaimer, the term of this patent is extended or adjusted under 35 U.S.C. 154(b) by 1701 days.

(21) Appl. No.: 11/255,893

(22) Filed: Oct. 21, 2005

(65) Prior Publication Data

US 2006/0086237 A1 Apr. 27, 2006

Related U.S. Application Data

(60) Provisional application No. 60/622,294, filed on Oct. 26, 2004.

(51) Int. Cl.
*H03G 3/00* (2006.01)
*G10H 1/02* (2006.01)

(52) U.S. Cl. ........................................... 381/63; 84/630

(58) Field of Classification Search .................... 381/63, 381/103; 84/630, DIG. 26, 707; 700/94
See application file for complete search history.

(56) References Cited

U.S. PATENT DOCUMENTS

| | | | | | |
|---|---|---|---|---|---|
| 4,063,034 | A * | 12/1977 | Peters | 381/17 |
| 4,706,291 | A | 11/1987 | Kakubo et al. | 381/63 |
| 4,803,731 | A * | 2/1989 | Niimi et al. | 381/63 |
| 5,146,507 | A | 9/1992 | Satoh et al. | |
| 5,195,140 | A * | 3/1993 | Kudo et al. | 381/94.3 |
| 6,078,669 | A * | 6/2000 | Maher | 381/17 |
| 2003/0007648 | A1* | 1/2003 | Currell | 381/61 |

OTHER PUBLICATIONS

Jot J-M, Cerveau L, Warusfel O (1997) Analysis and synthesis of room reverberation based statistical time-frequency model. In: Proc. 103rd Convention of the Audio Eng. Soc, 1997, preprint 4629.*
Jot, J.-M., Larcher, V., and Warusfel, O. (1995). "Digital signal processing issues in the context of binaural and transaural stereophony". Proc. 98th Conv. Audio Eng. Soc., preprint 3980.*
E. Piirilä, T. Lokki, V. Välimäki, "Digital Signal Processing Techniques for Non-exponentially Decaying Reverberation," in Proc. 1st COST-G6 Workshop on Digital Audio Effects (DAFX98) (Barcelona, Spain), 1998.*
M. R. Schroeder, "Natural Sounding Artificial Reverberation," J. Audio Eng. Soc., vol. 10, No. 3, pp. 219-223, Jul. 1962.*
J. A. Moorer, "About This Reverberation Business," Computer Music Journal, vol. 3, No. 2, pp. 13-28, 1979.*
Roads, C., The computer music tutorial. Cambridge, MA: The MIT Press, 1994, pp. 477 and 483.*
"Hybrid Reverberation Algorithm Using Truncated impulse Response Convolution and Recursive Filtering"; Sean Browne, University of Miami, Jun. 2001.
"Concert Halls and Opera Houses"; Leo Beranek; 2004.
"An Interdisciplinary Synthesis of ReverberationViewpoints"; Barry Blesser; Blesser Associates;Oct. 2001.

(Continued)

*Primary Examiner* — Vivian Chin
*Assistant Examiner* — Kile Blair
(74) *Attorney, Agent, or Firm* — Weingarten, Schurgin, Gagnebin & Lebovici LLP

(57) ABSTRACT

An electronic reverberation system employs a processor to produce a plurality of delays samples that are added to a direct signal to produce reverberant sound. The disclosed system generates or employs a list of gain value pairs that are produced based on control settings or are provided as fixed coefficients. The processor generates reverberation samples by applying these coefficients to delay samples and summing their amplitudes to produce reverberation waveform samples. The reverberation waveform samples are added to the direct signal.

48 Claims, 10 Drawing Sheets

OTHER PUBLICATIONS

"Eventide Reverb 2016"; Princeton Digital; 2003.

"Envelopment and Small Room Acoustics" ;David Griesinger; Sep. 21, 2000.

"Impulse Response Measurements Using All-Pass Deconvolution"; David Griesinger; Lexicon, Inc.; Apr. 1992.

"Welcome to David Griesinger's Home Page!"; Oct. 30, 2005.

"Reverb One/World-Class Reverb Processing for TDM Systems"; Digidesign; Jan. 2003.

"Implementing Reverberation Algorithms in Matlab"; Nicolas Holzem, Fernando Beltran, Jose Ramon Beltran, Francis Grenez, University of Zaragoza and Univeristy of Bruxelles; Aug. 1999.

Web pages of Yamaha Corporation of America—SREV1; pp. 1-6; Sep. 28, 2000.

* cited by examiner

UNNATURAL REVERBERATION

CROSS REFERENCE TO RELATED APPLICATIONS

This application claims the benefit of Provisional Application No. 60/622,294 filed Oct. 26, 2004 and titled UNNATURAL REVERBERATION.

STATEMENT REGARDING FEDERALLY SPONSORED RESEARCH OR DEVELOPMENT

Not Applicable

BACKGROUND OF THE INVENTION

The present invention relates to audio systems and more specifically to an improved method and apparatus for providing reverberation.

A listener in a room hears a combination of direct sound emanating from the sound source and a series of reflections from the room surfaces, which occur at different times. The frequency response at the listener location contains many peaks and valleys due to comb filtering, as all of the reflections and direct sound add together vectorially. Early attempts at electronic reverberation used a loudspeaker and microphone in a non-absorbent room. Later, space was saved by replacing the room with a metal plate or springs. When electronic analog delay became available, a decaying train of pulses could be produced by recirculating the output back to the input at slightly reduced gain. The development of computation and analog-to-digital and digital-to-analog converters allowed the same decaying train of analog pulses to be produced in the digital domain.

Reverberation can be characterized by its impulse response. Mathematically convolving a music signal with this impulse response produces the reverberant signal. Therefore, development in reverberation has focused on obtaining a desirable impulse response. The latest method of producing electronic reverberation, now becoming popular, is to use sampling. Recording the impulse response of a concert hall and feeding it into a convolver makes a non-reverberant music source sound somewhat as though it was produced in that concert hall.

Because of the large dimensions of concert halls, sound absorption by the audience and surfaces, and the speed of sound at approximately 1090 feet per second, listeners in even the best concert halls hear the direct sound at least 15 milliseconds before the first significant surface reflections arrive. The extreme high frequency content of the reflected sound is greatly attenuated relative to the direct sound. At low frequencies, depending upon the seat location, the reverberant sound usually exceeds the loudness of the direct sound. Some people like singing in a ceramic tiled shower stall where the reflected sound arrives much sooner and has more high frequency content.

Electronic reverberation systems used in modern recordings have similar characteristics and provide more than 15 milliseconds of initial delay and attenuated high frequencies. The delay and lack of high frequency content in either the acoustic or artificial reverberation allows any noises or imperfections in the direct sound picked up by the microphones to be clearly heard.

Most people do not realize they are listening to a beat frequency that occurs among multiple instruments or voices sounding the same note. Depending upon frequency, phase, and harmonic differences, a listener may hear a shimmering effect or high frequency noise. In addition, bowed instruments produce mechanical noises, and wind instruments produce wind noises and occasionally annoying high harmonics. Percussion instruments have rattles, and voices can be raspy on certain notes. Close microphone techniques often exaggerate these imperfections.

Recording, transmission, and reproduction equipment may contribute their own imperfections or exaggerate those already present. For example, some recording engineers dislike the normal pulse code modulation (PCM) recording process due to irritating high frequency components they believe are not present in the live microphone signal. Lossy bit compression systems like MPEG-3 are also believed by some recording engineers to distort sound quality. Processes generally accepted by these same engineers are old-fashioned analog tape recording and new Direct Stream Digital (DSD) recording used in making Super Audio Compact Discs (SACD). Instead of 16-bit PCM at 44.1 kHz used for compact discs, DSD is 1 bit PCM at 2.7 MHz.

Regardless of the sources of high frequency imperfections, the cumulative result is that nearly all existing recordings contain moments when the high frequencies are irritating enough to cause the listener to turn the volume down below the point of maximum enjoyment for the rest of the program—and sometimes to just turn it off. High frequency irritants can be reduced by attenuating the high frequencies using an equalizer. However, attenuating the high frequencies enough causes unsatisfactory loss of high frequency detail.

It would therefore be desirable to have a system and method for reducing the imperfections, distortions and/or irritating effects exhibited by recorded material.

BRIEF SUMMARY OF THE INVENTION

In accordance with the present invention, a method and apparatus are disclosed for reducing imperfections in recorded material by means of improved artificial reverberation. The presently disclosed system produces smooth, non-irritating high frequency sound without sacrificing high frequency detail or creating a hollow sound.

More specifically, the disclosed system, receives a series of digitized input waveform samples (known as the dry or direct signal) and temporarily stores each input waveform sample in a circular delay line having a predetermined number of delay line positions. The delay line is conceptually a First In First Out (FIFO) buffer. The delay line may be implemented as a circular delay line in a computer memory or a FIFO if implemented in hardware. A computational component utilizes a list of gain value pairs to create a reverberation signal including a series of reverberation waveform samples, each sample having an associated amplitude. Each gain value pair includes a first value that identifies a position in the delay line relative to the current sample position and a second value that specifies a gain coefficient.

Each reverberation sample is calculated in real time by the computational component. To calculate a current reverberation sample, the computational component accesses each gain value pair in the gain value pair list. For each gain value pair, the computational component computes an intermediate value by accessing a prior input sample amplitude from a relative delay line position specified by the first value in the respective gain value pair and by multiplying that amplitude by the second value, or gain coefficient, in the respective gain value pair. The computational component calculates an intermediate value by performing this multiplication for each delay line position specified in the list of gain value pairs and adds all of the intermediate values to produce the current reverberation waveform sample. The reverberation signal is a series of reverberation waveform samples (known as the wet signal).

A composite digital audio signal consisting of a series of composite waveform samples having respective sample amplitudes is generated by attenuating each current reverberation waveform sample and adding the attenuated reverberation waveform sample to the current input waveform sample.

The lists of gain value pairs may be generated in several ways. In one embodiment, an operator sets a number of controls that establish certain parameters used to generate the list of gain value pairs. The computational component accesses the parameters and calculates the gain value pairs based upon the control settings established by the user. If the control settings are changed, the computational component generates a new list of gain value pairs based upon the new control settings. Since the adjustment of the control settings results in a modification of the list of gain value pairs used to generate the reverberation signal, the operator can adjust the characteristics of the reverberation signal via adjustment of the controls.

In another embodiment, the reverberation component generates the reverberation signal using a pre-generated list of gain value pairs. One or more pre-generated lists of gain value pairs that produce varying reverberation signal characteristics can be provided. In the circumstance where plural lists of pre-generated gain value pairs are available, the operator is provided the ability through an interface to select which of the plural lists of gain value pairs is to be used to generate the reverberation signal.

The first and second values in the list of gain value pairs describe an attenuation curve that includes a leading edge portion, a flat portion and a decay portion, the first values defining an X axis value and the second value defining a Y axis value. Parameters associated with these portions of the attenuation curve may be adjusted via the operator controls when such controls are employed.

Unlike conventional reverberation systems, the list of gain value pairs in certain embodiments includes an initial gain value pair having a first value that specifies a delay line position that is delayed from the current time by a period of less than 15 milliseconds. The first values of additional gain value pairs in the gain value pair list may also identify delay line positions having delays from the current time of less than or equal to 15 milliseconds.

In many useful waveforms, the reverberant energy is less than that of the direct sound at low and middle frequencies and gradually increases to where it exceeds the direct sound at very high frequencies. The reverberant energy does not necessarily increase per se at high frequencies. It can exceed the direct sound if the direct sound is attenuated as frequency increases.

Other features, aspects and advantages of the presently disclosed system and method will be apparent to those of ordinary skill in the art from the Detailed Description of the Invention that follows.

BRIEF DESCRIPTION OF THE SEVERAL VIEWS OF THE DRAWINGS

The invention will be more fully understood by reference to the Detailed Description of the Invention in conjunction with the drawings of which.

DETAILED DESCRIPTION OF THE INVENTION

U.S. Provisional Patent Application No. 60/622,294 entitled Unnatural Reverberation and filed Oct. 26, 2004 is incorporated herein by reference.

An improved system and method for producing reverberation is disclosed. The disclosed system receives an input signal having a periodic series of digital input waveform samples. Each sample has an associated amplitude. The system is designed to employ an audio input sampled at common audio sampling rates of 44100, 48000, 88200, or 96000 samples per second, and each sample for each channel in one embodiment is a 32-bit floating-point number representing the instantaneous signal amplitude.

System Operation

Figure 1:
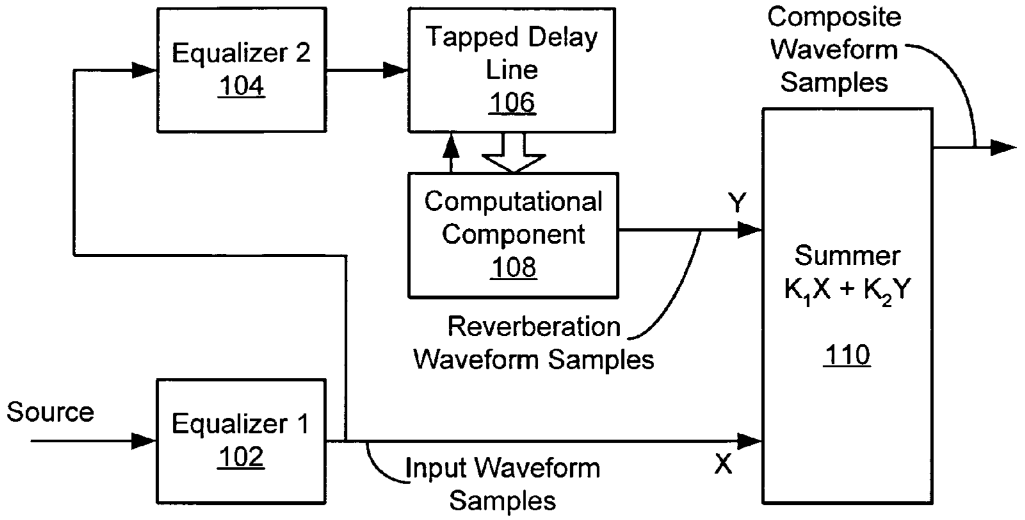
FIG. 1 is a block diagram depicting a system in accordance with the present invention employing a single tapped delay line and computational component.

A system for generating artificial reverberation in accordance with the present invention is depicted in FIG. 1 Referring to FIG. 1, the system includes an Equalizer 1 102 that receives a digital audio source at its input. The output of Equalizer 1 102 is coupled to the input of Equalizer 2 104 which has its output coupled to the input of a tapped delay line 106. The output of Equalizer 1 102 in FIG. 1 feeds both Equalizer 2 104 and a Summer 110 and is referred to herein as the input signal, the direct or the dry signal. The computational component 108 cooperatively with the Tapped Delay Line 106 generates a reverberation signal as is described below in greater detail.

In typical operation Equalizer 2 104 is set to boost high frequencies above 2 kHz and attenuate frequencies below 200 Hz for the reverberation signal. Equalizer 1 102 rolls off high frequencies for both the reverberation signal and the direct signal from the source input. The net effect on the frequency response of the composite output signal is fairly uniform or flat response with ripples due to comb filtering.

The range of high frequency boost at 20 kHz and attenuation at 15 Hz due to equalizer 104 may be quite extreme—for example +40 dB at 20 kHz to −40 dB at 15 Hz. The corresponding high frequency attenuation produced by equalizer 1

102 for rebalanced sound may be as much as 30 dB at 20 kHz. In this example the reverberation content of the composite signal exceeds the direct signal component by about 30 dB at 20 kHz. At 15 Hz, the direct signal component exceeds the reverberation by about 40 dB. (The reverberation process may itself may boost bass 10 dB or thereabouts.) The listening effect is clean, musical high frequencies with bass that is not muddy.

More specifically, the output of Equalizer 1 comprises a signal which is considered an input signal having a series of digital waveform samples. Each input waveform sample has an associated amplitude. The input waveform samples are processed by Equalizer 2 104 and are coupled to a Delay Line 106 which is conceptually a First In First Out Buffer. Based on the implementation, the Delay Line 106 may comprise a FIFO hardware buffer. The Delay Line 106 may also be implemented as a circular buffer in memory of a predetermined length.

In one embodiment, the Delay Line 106 is a contiguous section of memory storing 529,200 24-bit fixed point or 32-bit floating-point numbers representing the sample amplitudes of 6 seconds of audio at 88,200 Hz sampling rate. Samples from Equalizer 2 104 are clocked into the input or stored in the first location of the Delay Line 106 every 11.337868 microseconds in one illustrative embodiment. It will be understood by those of ordinary skill in the art that specific sample rates, buffer sized, clock speeds, etc may be modified to accommodate specific design requirements.

Each sample arriving after the Delay Line 106 has been filled replaces the oldest stored sample. Thus, the Delay Line 106 accommodates continuous sample input at 88,200 Hz and relative to the current (latest) sample position always holds 6 seconds of samples in the illustrated embodiment. When the Delay Line 106 is implemented in a memory as a circular buffer, samples that were stored at earlier times are accessed by counting backward from the position of the current sample as will be subsequently illustrated.

The computational component 108 produces a reverberation signal which is a series of reverberation waveform samples. Each reverberation waveform sample has a reverberation sample amplitude. The reverberation waveform signal is fed to the Summer 110. The Summer 110 sums an attenuated or scaled version of the reverberation waveform samples output from the computational component 108 with the input waveform samples which may also be optionally scaled. The output of the summer is a composite signal having a series of composite waveform samples. Each composite waveform sample has a composite waveform sample amplitude. The scaling for the Summer 110 mixes the reverberation signal in a pleasing proportion with the direct signal from Equalizer 1 102.

Each reverberation sample that is generated by the computational component 108 is calculated in real time. The computational component utilizes a list of gain value pairs to calculate the amplitude of each current reverberation waveform sample. Each gain value pair includes a first value that identifies a position in the Delay Line 106 and a second value that specifies a gain coefficient.

Figure 2:
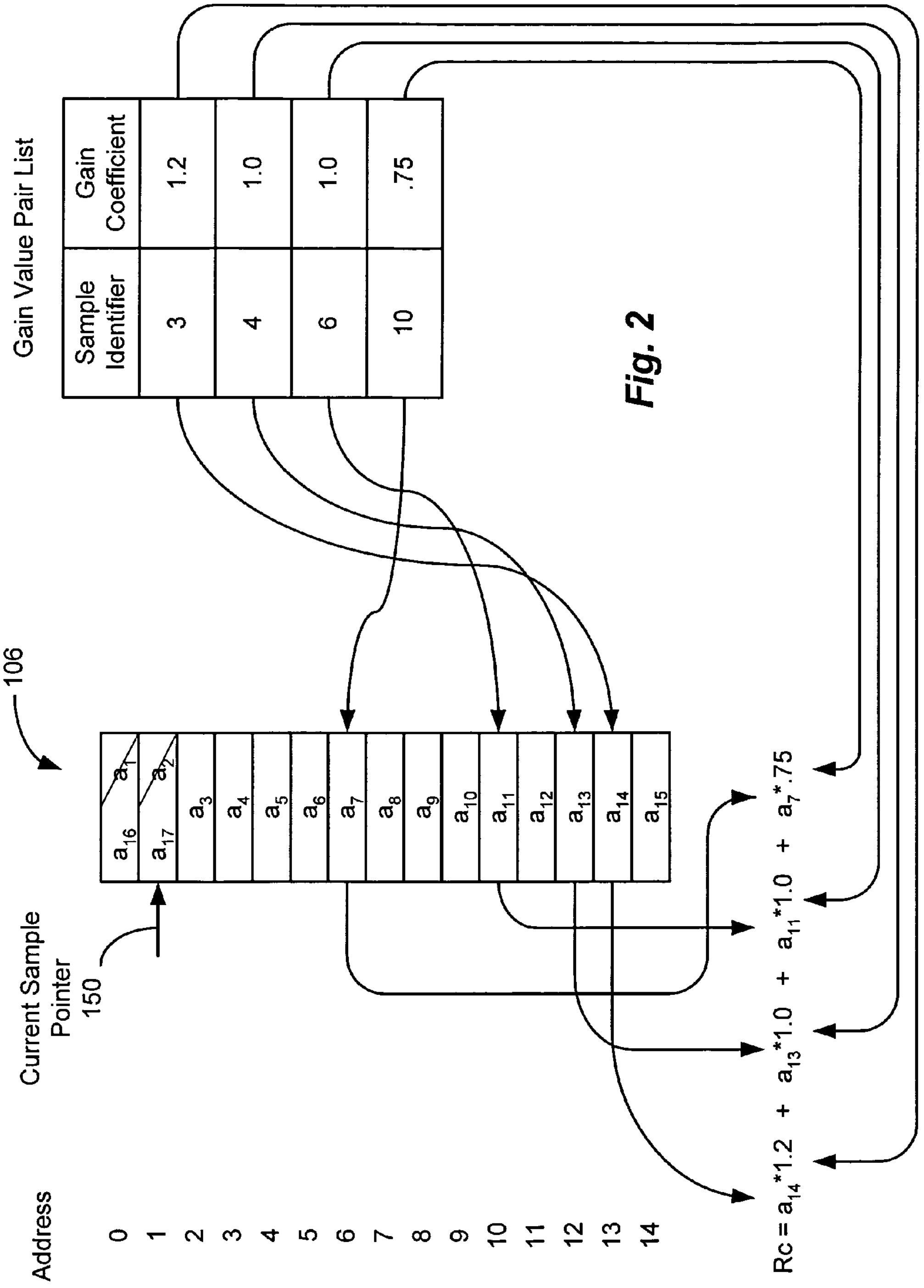
FIG. 2 is a diagram depicting the method for calculating current reverberation waveform sample amplitudes in accordance with the present invention.

The manner of operation of the delay line or circular buffer 106, and the manner in which the computational component 108 generates the amplitude of each current reverberation waveform sample cooperatively with the delay line 106, and the list of gain value pairs will be more fully understood by reference to the simplified illustration of FIG. 2. FIG. 2 depicts a Delay Line 106 (FIG. 1) which is implemented as a circular buffer in a memory. For purposes of discussion, a circular buffer having 15 consecutive memory locations labeled address 0 - 14 is shown. It should be recognized that, in practice, the circular buffer could occupy thousands of locations in memory and that the size of the circular buffer is a matter of design choice. The operation of the circular buffer with respect to the storage of newly received input samples is described below.

Upon receipt of each new input sample, the computational component 108 (FIG. 1) uses a current sample pointer 150 and stores the new sample in the next sequential location in the circular buffer. The computational component 108 then modifies the value of the current sample pointer to point to the new sample. By way of example, assuming a series of input samples 1 - 17 having amplitudes $a_1$-$a_{17}$, and assuming that input sample 1 having amplitude $a_1$ is the first to arrive and the sample 17 having amplitude $a_{17}$ is the last to arrive, the computational component 108 stores $a_1$ in address 0, $a_2$ in address 1 , etc. and stores $a_{15}$ in address 14 . When the next input sample, namely sample 16 having amplitude $a_{16}$ arrives, the computational component 108 stores that sample in the next logical location in the circular buffer, i.e. address 0 which contains the then oldest input sample (i.e. sample 1 having amplitude al) in the buffer. When the input sample 16 having amplitude $a_{16}$ is written into address 0 , sample 1 having amplitude $a_1$ is overwritten and sample 1 effectively exits the circular buffer as depicted in FIG. 2. Similarly, upon the arrival of the input sample 17 having amplitude $a_{17}$, sample 17 is written into the memory address that holds the then oldest sample in the buffer, namely address 1 . By storing sample 17 in address 1 , sample 2 having amplitude $a_2$ is overwritten and effectively exits the delay line or buffer 106. Following the storing of sample 17 having amplitude $a_{17}$ in address 1 , the current sample pointer 150 points to that sample which is the most recently received sample in the illustration of FIG. 2. For the following explanation of how current reverberation samples are calculated it is assumed that the circular buffer contains the sample amplitudes depicted in FIG. 2 and that the current sample pointer is pointing to the current input sample in address 1.

As previously indicated, the computational component 108, cooperatively with the circular buffer and the list of gain value pairs, generates each current reverberation waveform sample during the time period of a single sample interval. The manner in which each current reverberation waveform sample Rc is calculated is also depicted in FIG. 2.

To calculate the current reverberation waveform sample, the computational component 108 generates a plurality of intermediate values. The computational component 108 then sums all of the intermediate values to obtain the amplitude of the current reverberation waveform sample $R_c$. The number of intermediate values corresponds to the number of entries in the list of gain value pairs. Each intermediate value is calculated by retrieving a selected one of the amplitudes in the circular buffer using the sample identifier in one of the gain value pairs and by multiplying the retrieved amplitude by the gain coefficient in the gain value pair associated with the sample identifier.

By way of example, the first gain value pair in the illustrated list of gain value pairs is 3, 1.2. The value 3 is a number that is used to count backwards in the circular buffer to identify the location of the contents in the circular buffer to be used in the immediate calculation. The second value in the gain value pair is the gain coefficient. Thus, to calculate the first intermediate value, the computational component 108 identifies the address of the current sample pointer (Address 1 in the instant example) and counts backward in the buffer to identify the buffer position to be used in the generation of the respective intermediate value. By counting back 3 logical locations in the buffer from the current value pointer 150, the computational component 108 identifies address 13 which contains amplitude $a_{14}$. To obtain the first intermediate value corresponding to the first gain value pair in the list of gain value pairs, the computational component 108 multiplies the amplitude $a_{14}$ by 1.2, the gain coefficient in the first gain value pair. The computational component 108 stores the first intermediate value and then calculates the second intermediate value. More specifically, to calculate the second intermediate value, the computational component 108 counts back 4 logical locations from the address of the current sample pointer 150 using the value 4 from the sample identifier in the second gain value pair. The computational component 108 in this manner identifies address 12 as containing the contents $a_{13}$ to be used in the calculation of the second intermediate value. The computational component 108 retrieves the amplitude $a_{13}$ and multiplies that amplitude by the gain coefficient 1.0 found in the second gain value pair to obtain the second intermediate value. This process is repeated for each gain value pair until all intermediate values have been calculated as depicted in FIG. 2. All of the intermediate values are then summed to obtain an amplitude value Rc, i.e. the current reverberation waveform sample.

In one embodiment, the computational component 108 calculates a new reverberation waveform sample component every 11.337868 microseconds and in this timeframe performs all of the multiplications and additions required to generate the value Rc as described above.

Additionally, in the embodiment depicted in FIG. 3 (described below), the computational components 108.1 and 108.2 calculate new current first and second reverberation waveform samples every 11.337868 microseconds in the manner described above with respect to computational component 108 and in this timeframe perform all of the necessary multiplications and additions.

The computational component 106 may comprise a processor executing preprogrammed instructions stored in a memory, a Digital Signal Processor (DSP), a custom or semi custom integrated circuit, or any combination of the above configured to perform the functions herein described.

The Summer 110 may be implemented within the computational component 108 as a software module or alternatively as any hardware or processor based component that is operative to perform the summing function herein described. More specifically, referring to FIG. 1, the Summer 110 adds K2 times the current reverberation sample amplitude Y to K1 times the input sample amplitude X 88,200 times per second to produce the composite waveform sample output.

Using a high speed Pentium processor as the computational component 106, all the described operations from fetching an input sample to delivering the corresponding composite output can take place during a single 11.337868 microsecond sample period. Other systems may be designed to use additional sample periods for processing.

Since the presently described system is a linear system there is flexibility in the order of the blocks. For example, Equalizer 2 104 can come after the computational component 108.2 instead of before the Delay Line 106. Equalizer 2 104 can also be set differently and fed directly by the input instead of being fed by the output of Equalizer 1 102. The arrangement shown was selected for the convenience of having tone controls in Equalizer 1 102 affect both the direct signal and the reverberation signal, and optimum signal-to-noise ratio.

In one embodiment, the Delay Line 106 provides for storage of one sample every 11.337868 microseconds and accommodates 529,200 samples. This corresponds to 6 seconds of audio at an 88,200 Hz sampling rate. At this sampling rate, the computational component 108 generates a series or reverberation waveform samples that vary in magnitude and polarity with time. The polarity of the respective reverberation waveform sample is governed by the sign of the gain coefficient in the respective gain value pair. The manner in which the polarities may be assigned is described below.

The gain value pair list represents the impulse response of the reverberation generator. The computational component 108 generates a single reverberation sample by accessing the entire list of samples in the Delay Line 106 identified in the gain value pair list. For each sample time in a gain value pair, when the Delay Line 106 constitutes a circular buffer in a memory, the computational component 108 subtracts the first value of the gain value pair from the current sample position in memory to fetch the amplitude of the appropriate older sample. If the position sought is before the beginning of the Delay Line 106, the count resumes from the other end. Each fetched amplitude is multiplied by its respective gain in the list and all products are summed together to form a single reverberation sample as described above. At 88,200 Hz the reverberation calculation amounts to 19,668,600 (223×88,200) multiply-accumulate and other operations for each audio channel.

The energy relationship between the reverberant signal and the direct signal is brought about by equalizing the direct signal and the reverberant signal separately before adding them together. To achieve intimacy in the sound, the initial delay is made very short, less than or equal to approximately 15 milliseconds, unlike real or existing artificial reverberation. More specifically, the time between the current time and the time of receipt of the most recently stored sample that is used in the calculation of the current reverberation waveform sample is less than or equal to approximately 15 milliseconds. The short initial delay helps to clarify and smooth the reproduction of high frequency percussive instruments such as cymbals, triangle, and tambourine. It also helps voices and is useful when playing DVD movies. Many useful reverberation waveforms produced by the presently disclosed system have initial delays as short as 40 microseconds.

Another characteristic of the most effective reverberation waveforms is very high density of delays immediately after the initial delay, unlike real or prior artificial reverberation. Delays spaced apart as little as 30 microseconds and alternating in polarity with gradually increasing spacing produce a comb filtering effect with a large number of peaks and valleys ranging as high as 16.7 kHz. It is these peaks and valleys in the frequency response that make high frequencies appear brilliant and musical.

A single delay in the impulse response corresponds to a reflection from a surface in an acoustic room. Unlike in a room, each delay is a perfect wide band copy of the input delayed in time, either in the same polarity or inverted.

Cascaded Reverberation Signal Generation

Figure 3:
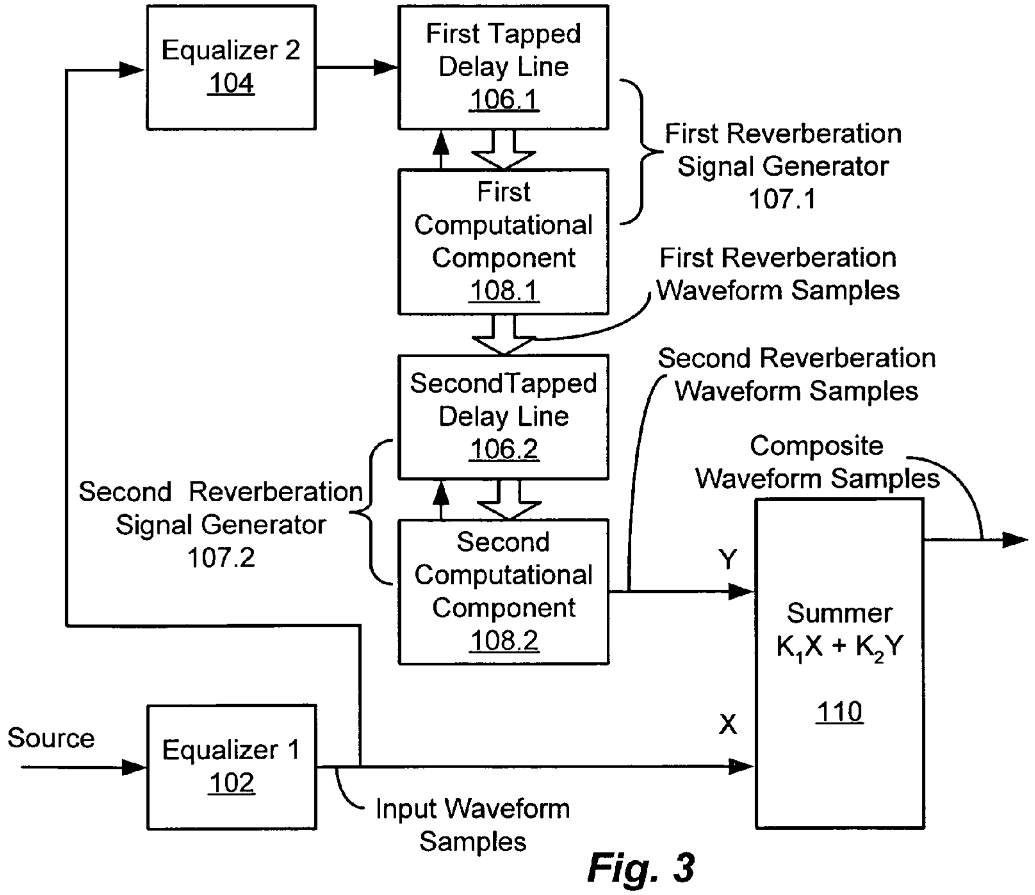
FIG. 3 is a block diagram depicting a system employing a first computational component cooperative with a first delay line to produce a first reverberation signal which feeds a second delay line that is cooperative with a second computational component to produce a second reverberation signal.

FIG. 3 depicts a system generally as shown in FIG. 1. However, cascaded reverberation waveform generators are employed. More specifically, referring to FIG. 3, the system includes a first reverberation waveform generator for generating a first reverberation waveform signal comprising a first Delay Line 106.1 and a first computational component 108.1. The system also includes a second reverberation waveform generator for generating a second reverberation waveform signal and comprising a second delay line 106.2 and a second computational component 108.2. Functionally, the output of the first reverberation waveform generator is fed to the input of the second reverberation waveform generator and the output of the second reverberation waveform generator is coupled to the summer 110. The first and second reverberation waveform generators 107.1 and 107.2 may utilize the same gain value pairs list with adjustment made in the polarity of the gain coefficients in one of the lists. Alternatively, the first and second waveform generators 107.1 and 107.2 may utilize separate gain value pair lists which may or may not contain the same gain value pairs. Moreover, if separate gain value pair lists are used for the two reverberation waveform generators 107.1 and 107.2, separate user controls such as described below may be provided to allow control over the generation of each of the gain value pair lists.

The computational components 108.1 and 108.2 may each generate their own list of gain value pairs. It should be appreciated that the computational components 108.1, and 108.2 may include reusable software modules and/or routines. Moreover, the first computational component 108.1 may comprise a processor executing one or more software modules and/or routines using a first list of gain value pairs to generate the first reverberation waveform samples. Furthermore, the second computational component 108.2 may comprise the same processor executing the same modules and/or routines using a second list of gain value pairs to generate the second reverberation waveform samples. Furthermore, the lists of gain value pairs used by the two reverberation waveform sample generators may be the same list with adjustments in the polarities of the gain coefficients.

When the first reverberation waveform generator 107.1 uses a gain value pair list having p gain value pairs and the second reverberation waveform generator 107.2 uses a gain value pair list having q gain value pairs, this effectively increases the number of reverberation delays to p*q. The system may optionally operate in a low density mode in which only a single reverberation subsystem is employed or a high density mode in which the output of the first subsystem feeds a second to increase the effective number of delays in the second reverberation waveform sample.

The characteristics of reverberation produced by cascaded reverberation waveform subsystems such as described above are determined by distinct sets of controls that specify parameters used to calculate lists of gain value pairs for each of the reverberation waveform generators. Alternatively, a common set of controls may produce two lists of gain value pairs which are the same except for differences in polarities of their second values.

Controls

The reverberation controls allow the user to modify parameters used to generate the list or gain value pairs.

The gain value pair lists may either be pre-generated and stored or alternatively generated immediately prior to operation of the reverberation system. In the event the gain value pair list(s) are pre-generated, most of the user controls described below are not required for the run time system.

In addition, when the lists of gain value pairs are pre-generated, one or more lists of gain value pairs may be provided. Each list of gain value pairs defines a particular reverberation characteristic. In the case where multiple sets of gain value pairs are available, the particular list to be employed may be selected by a user via a graphical user interface or via any other suitable selection technique. In the case where pre-generated sets of gain value pairs are employed, it will be appreciated that the reverberation controls described above are not used.

The controls described below are primarily provided to allow the user to adjust reverberation characteristics of the run-time system by modifying the list of gain value pairs.

The following discussion describes an exemplary technique for generating a list of gain value pairs based on the user control settings.

Figure 4:
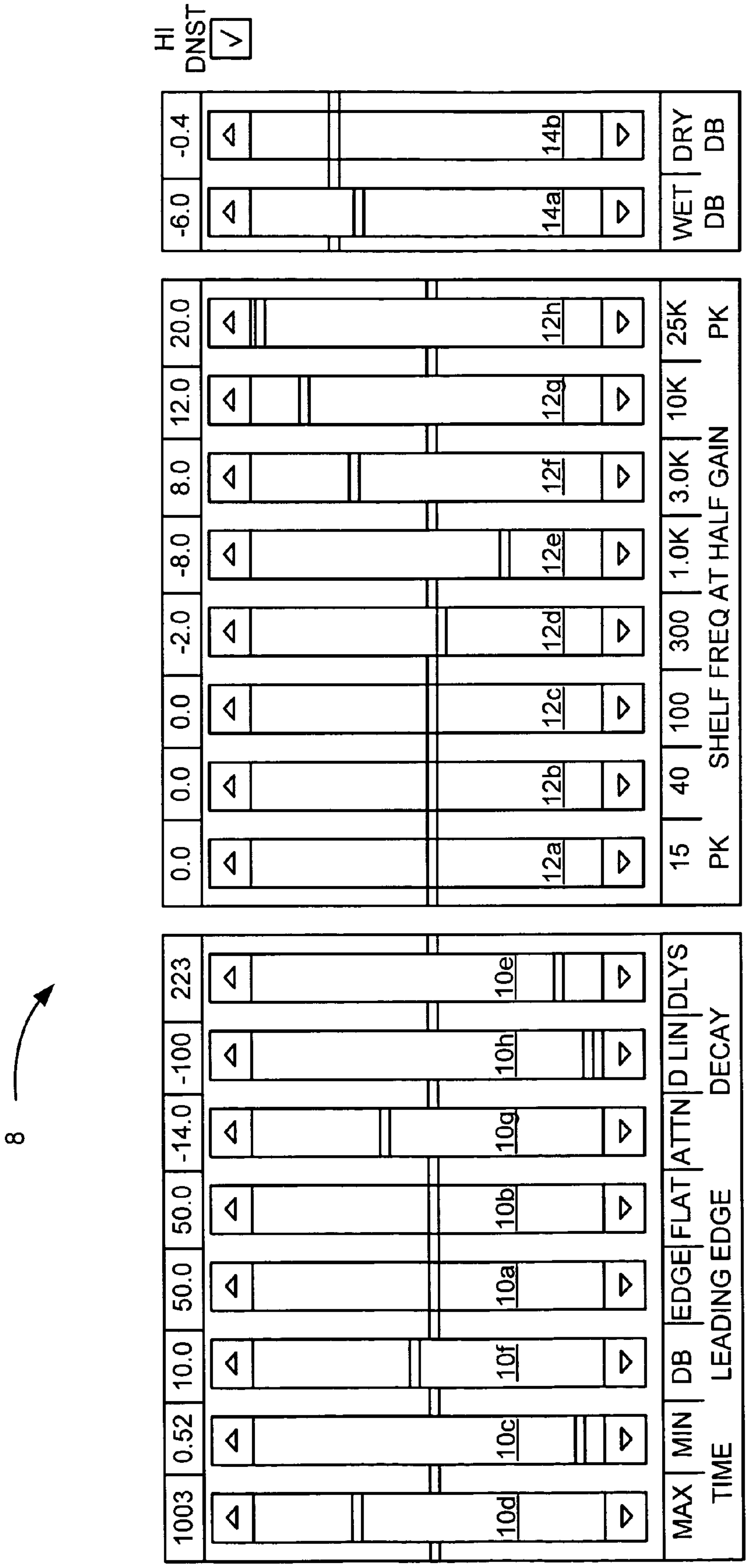
FIG. 4 is a representation of user controls for setting parameters used in the generation of a list of gain value pairs.

Reverberation system controls are provided as a graphical user interface 8 on a personal computer, as generally depicted in FIG. 4. The settings for the controls 10*a*-10*h* serve to define the characteristics of a reverberation attenuation curve. The reverberation attenuation curve specifies the magnitude of the gain coefficients in the list of gain value pairs as a function of delay time.

Figure 5A:
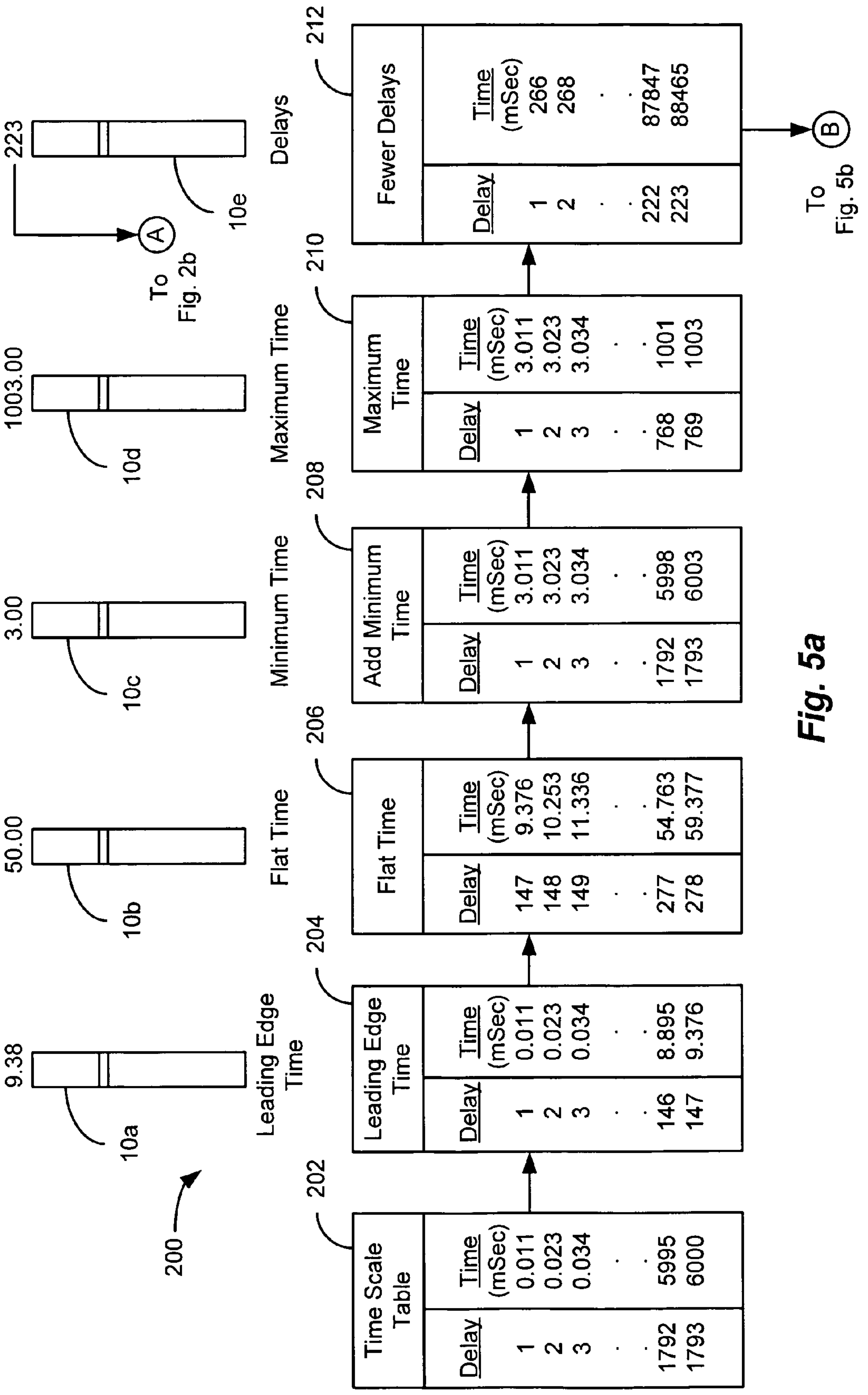
FIGS. 5*a* and 5*b* are a block diagram illustrating signal processing employed to achieve processor generated reverberation in accordance with the present invention.

The controls 12*a*-12*h* determine the frequency response of the input to the reverberation controls. The wet DB and dry DB controls 14*a* and 14*b* respectively control the mixing of the reverberation (wet) signal output and the direct (dry) signal output. More specifically, the graphical user interface 8 includes controls in the form of a Leading Edge Time control 10*a*, a Flat Time Control 10*b*, a Minimum Time control 10*c*, a Maximum Time control 10*d*, a Delay Number control 10*e*, a Leading Edge DB control 10*f*, a Maximum Attenuation control 10*g*, and a Decay Linearity control 10*h*. Referring to FIG. 5*a*, the system employs a Time Scale table 202 that specifies for each delay (in the present example 1793 delay points), the delay time from time 0 to the relevant delay point. Descriptions of the individual controls are provided below. The delay time values produced by the various controls refer to the impulse response of the reverberation and corresponding prior sample positions in a circular delay line relative to the current sample.

Figure 6:
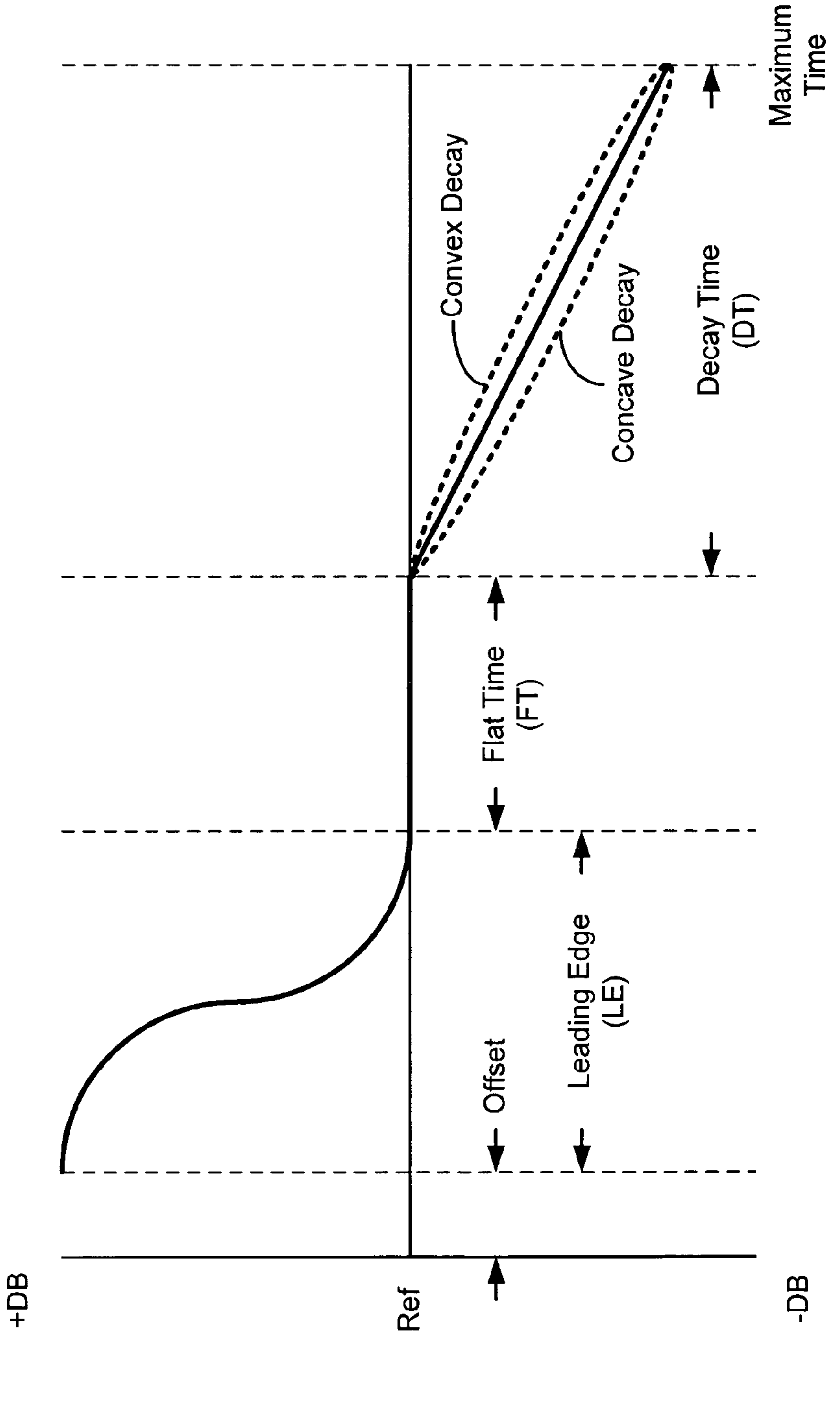
FIG. 6 is a graph depicting an exemplary reverberation attenuation curve produced in the components of FIGS. 2*a* and 2*b;*

LEADING EDGE TIME (mSec)—The Leading Edge Time control 10*a* specifies the amount of time between zero delay and the time the reverberation attenuation curve takes to attenuate to a 0 DB or flat portion (FIG. 6). Referring to FIG. 5*a*, by way of illustration, the LEADING EDGE TIME control 10*a* is set to 9.376 (readout rounded to 9.38) milliseconds.

FLAT TIME (mSec)—The delay attenuation curve that is applied to the input signal may include a flat portion that has 0 DB attenuation or a specified constant reference attenuation other than 0 DB (FIG. 6). The length of the FLAT TIME attenuation portion is adjustable by a user via the FLAT TIME control 10*b*. The flat attenuation portion starts at the end of the period set using the LEADING EDGE TIME control 10*a*, and ends at the delay time equal to the sum of the time specified by the LEADING EDGE TIME control 10*a* plus the time (in mSec) specified by the FLAT TIME control 10*b*.

MIN DELAY (mSec)—The MIN DELAY control 10*c* specifies a delay period in milliseconds that is added to all delay times in the Time Scale Table 202 (FIG. 5*a*).

MAX DELAY (mSec)—The MAX DELAY control 10*d* specifies the delay time to the last delay line position used. In one exemplary embodiment, the maximum delay time to the last delay line position is 5.1 seconds.

DELAYS (#)—The Delay Control 10*e* specifies the number of delay line positions that are to be employed in the calculation of the current reverberation waveform sample. In the illustrated embodiment, the number of delay line positions to be used is selectable from a minimum of 1 to a maximum of 1611.

Leading Edge DB (DB)—The Leading Edge DB Control 10*f* (FIG. 5*b*) specifies the maximum gain in DB during the leading edge of the reverberation attenuation curve (FIG. 6). The Leading Edge DB control 10*f* in one embodiment allows the adjustment of the Leading Edge Maximum gain between −40 and +40 DB.

DECAY DB (DB)—The Decay DB Control 10*g* specifies the maximum attenuation of the signal at the last delay line position used in the calculation of the current reverberation waveform sample. The Decay DB Control 10*g* permits the attenuation at the last delay line position to be adjusted between +10 DB and −90 db.

DECAY LINEARITY—The Decay Linearity control 10*h* (FIG. 5*b*) modifies the shape of the reverberation attenuation curve after the flat portion of the attenuation curve (FIG. 6).

High Density/Low Density Selection—The system permits the selection of a high density or low-density reverberation mode. In the low density mode, the number of delays specified by the DELAY control 10*e* are not cascaded. In the high density mode the output of a first reverberation signal generator is cascaded with a second reverberation signal generator to produce a greater number of reverberation waveform samples as subsequently discussed. The selection may be made via a check box (FIG. 4) or any other suitable selection technique. By way of example, if the DELAY control 10*e* is set to specify 23 samples and the high density mode is selected, each of the 23 delays produces an additional 23 delays resulting in 23*23=529 reverberation delays.

Processing to Generate List of Gain Value Pairs

Figure 5B:
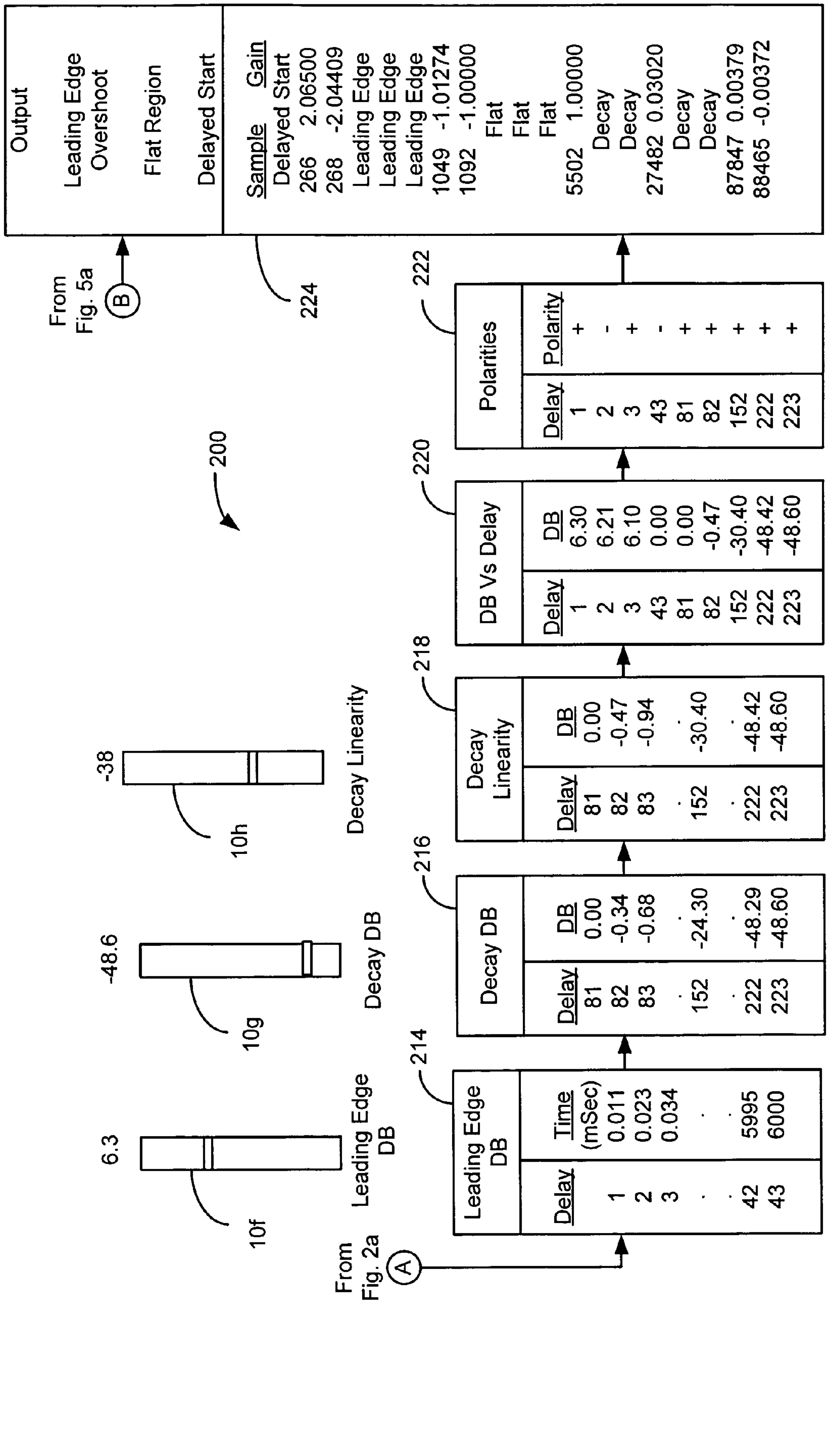

The signal processing within the presently disclosed system to generate a list of gain value pairs using the parameters from the user controls is illustrated in FIGS. 5*a*-5*b*.

The system 200 for generating a list of gain value pairs includes the Time Scale Table 202 that contains delay or sample numbers and the corresponding time from the input signal to the point on the reverberation attenuation curve. A delay is a time-delayed replica of the input signal produced by a circular buffer, which acts as the tapped delay line 106 in memory (FIG. 1). Good sounding reverberation has monotonically increasing time between delays. Constant spacing produces a buzzing or ringing effect, random spacing produces noise, and too much spacing change while the reverberation signal has little attenuation produces a sensation of rapidly decreasing pitch. If a person listens carefully to a handclap, it is apparent that reverberation in a real room produces a decreasing pitch as reflections arrive from more and more distant surfaces. Too much of this effect is often considered unpleasant.

The Time Scale table 202 may be produced by using arbitrary numbers, a formula for exponentially increasing spacing, or separate formulas for different sections of the delays, or by drawing a curve and measuring values at various points along the curve. In the exemplary Time Scale table 202 depicted in FIG. 5*a*, the times of the first three and the last two delays show that the spacing starts at approximately 12 microseconds and ends at 5 milliseconds, where the last delay, number 1793, occurs at 6 seconds, a spacing ratio of 417/1. This spacing ratio is unlike existing electronic reverberation and reverberation produced in real rooms where typically no reflected signal is observed during the first 15 milliseconds after the direct or input signal.

In the illustrated embodiment, the maximum reverberation delay (in low-density mode as subsequently described) is 6 seconds. While the maximum reverberation delay is 6 seconds (in low-density mode) in the illustrated embodiment, it should be appreciated that the maximum reverberation time for a given system is a matter of design choice. The actual duration of the reverberation, using only a portion of the 6 second time scale, is selected on the computer display using a mouse-actuated Maximum Time control 10*d* (FIGS. 4 and 5*a*). This total reverberation period is divided into four time periods, namely, Minimum Time, Leading Edge Time, Flat Time, and the remaining Decay Time. An exemplary attenuation curve is illustrated in FIG. 6. As shown, the attenuation curve includes an offset time that is established by the Minimum Time control 10*c* (FIGS. 4 and 5*a*). In one embodiment, the Leading Edge portion of the attenuation curve designated LE comprises a portion of a sinusoidal waveform extending generally between 90 and 270 degrees. The length of the Leading Edge portion of the attenuation curve is established by the Leading Edge Time control 10*a* (FIGS. 4 and 5*a*). The peak gain of the Leading Edge portion of the attenuation curve is set by the Leading Edge DB control 10*f* (FIGS. 4 and 5*b*). The peak gain corresponds to the gain at the beginning (or leftmost edge) of the Leading Edge portion of the attenuation curve. Following the Leading Edge portion, the attenuation curve includes a Flat Time (FT) portion during which the reverberation attenuation curve exhibits a constant gain such as unity gain. To prevent the reverberation waveform signal from over-riding the input signal, the gain of the flat portion of the attenuation curve may be less than unity. The length of the Flat Time portion of the attenuation curve is specified by the Flat Time control 10*b* (FIGS. 4 and 5*a*). Following the Flat Time portion of the attenuation curve, the attenuation curve includes a Decay Time (DT) portion. The Decay Time portion extends from the end of the Flat Time portion of the attenuation curve to the end of the reverberation waveform which equals the period specified by the Maximum Time control 10*d* (FIGS. 4 and 5*a*).

Referring to FIG. 5*a*, the Leading Edge Time table 204 shows the first three and the last two delays of a leading edge time period, which, in the illustrated example, is set at 9.376 milliseconds by the Leading Edge time control 10*a*. During the Leading Edge (LE) time portion (FIG. 6), in the illustrated example, the gain decreases from a maximum gain of 6.3 DB to 0 DB or unity gain at delay number 147, the end of the Leading edge period. The Leading Edge Time table 204 may be embodied in a table distinct from the Time Scale table 202 or as entries within the Time Scale table 202 that are designated as constituting the Leading Edge Time table 204 entries.

The Flat Time table 206 shows the first three and the last two delays of the flat time period starting at 9.376 milliseconds and ending at 59.377 milliseconds, delay number 278. As depicted in the exemplary FIG. 5*a*, the Flat Time period is specified to be 50 milliseconds, and the Flat Time period starts at 9.376 milliseconds which corresponds to the end of the Leading Edge portion of the attenuation curve. During the Flat Time period, the curve exhibits constant gain (i.e. 0 DB in the illustrated example). Since the Flat Time control 10*b* in the illustrative example specifies a Flat Time period (FT) of 50.00 milliseconds, the Flat Time period ends at approximately 59.377 milliseconds which is rounded to correspond to sample 278 at 59.377 milliseconds as depicted in Flat Time table 206. In one embodiment, the actual full scale ranges of the Leading Edge Time control 10*a* and the Flat Time control 10*b* vary with the setting of the Maximum Time control 10*d* in order to accommodate maximum time settings as short as 10 milliseconds.

The Minimum Time control 10*c* specifies a time offset that is to be added to all times in the Time Scale table 202. In the illustrative embodiment, the Minimum Time control 10*c* allows for an offset time anywhere from 40 microseconds to 100 milliseconds for all of the times in the Time scale table 202. As illustrated in FIG. 5*a*, the addition of the Minimum Time (3 milliseconds) specified by the Minimum Time control 10*c* to the Time Scale Table 202 produces the Add Minimum Time table 208. In the present example, the Add Minimum Time table 208 illustrates that the times in the Time Scale table 202 have all increased by 3 milliseconds as specified by the Minimum Time control 10*c*. The remaining time after the Flat Time portion is the portion of the attenuation curve extending to the end of the attenuation curve specified by the Maximum Time control 10*d*, during which the reverberation signal gain decays.

As previously noted, the Delays control 10*e* sets the total number of delays that are employed. In the present example, the number of delays or samples may be between 21 and 1611 depending upon the Maximum Time setting established by the Maximum Time control 10*d*.

In the illustrative example depicted in FIG. 5*a*, the Maximum Time control 10*d* is set at 1003 milliseconds. This selection cuts off the Add Minimum Time table 208 at delay 769 to produce the Maximum Time table 210. It should be appreciated that the Maximum Time table 210 may be provided as a selection or subset of the Add Minimum Time table 208.

The Delays control 10*e* is actually a delay density control but reads out the total number of delays. Its full-scale range is affected by the Maximum Time control setting, providing more delays for longer times. At the full-scale setting of the Maximum Time control 10*d*, the range of the Delays control 10*e* is 202 to 1611 delays. The 1611 delays correspond to 5 seconds on the Time Scale table 202. At the shortest Maximum Time and Minimum Time settings totaling only 10 milliseconds, the range of the Delays control in the illustrative example is between 21 and 138. A setting for a single delay may also be provided.

The Delays control 10*e* functions by skipping some of the rows in the Maximum Time table 210 to produce the Fewer Delays table 212. The result is shown in the Fewer Delays table 212 for a Delays control 10*e* setting of 223 delays at 1003 milliseconds maximum as established by the Maximum Time control 10*d*. In the Fewer Delays table 212, delay times have been converted to sample times at the assumed sampling rate of 88200 Hz by rounding to the nearest sample. Samples recur every 11.338 microseconds. More specifically, the first sample of the 223 samples occurs at 3.011 milliseconds. 3.011 milliseconds divided by the sample time of 11.337868 microseconds equals approximately 266 which indicates that the first delay sample will correspond to the 266th sample time. Similarly, the 223rd delay time occurs at the Maximum Time established by the Maximum Time control 10*d* which, in the present example, is 1003 milliseconds. 1003 milliseconds corresponds to the 88465th sample at the sample rate of 88200 Hz.

The specific samples are reduced in number by using those samples in the Maximum Time table 210 remaining after skipping 2 or 3 samples between those included in the Maximum Time Table 210. In the Maximum Time table 210 the last delay is number 769, whereas in the Fewer Delays table 212 the are only 223 delays, the final delay occurring at the time of delay number 769, i.e. 1003 milliseconds. The ratio 769/223 equals 3.448. Therefore by skipping every 3.448−1=2.448 samples in the Maximum Time table 210, the number of samples is reduced from 769 to 223. Since it is not possible to skip fractional sample numbers, it is necessary to round to the nearest sample number and the number skipped becomes 2 or 3, averaging close to 2.448.

The Leading Edge DB control 10*f*, the Decay DB control 10*g*, and the Decay Linearity control 10*h* (FIG. 5*b*) modify the gain of each sample occurring during the Leading Edge time and the Decay Time periods. These controls operate only on the delays selected in the Fewer Delays table 212 (FIG. 5*a*) by skipping rows. More specifically, these controls only operate on the 223 selected delays in the present example. The Leading Edge DB control 10*f* in the present example has set the gain of the first delay at +6.3 DB. Thereafter the gain of each successive delay is lower, reaching 0.0 DB at delay 43, (corresponding to delay 147 in the Leading Edge Time table 204) the end of the Leading Edge (LE) portion of the reverberation attenuation curve. The Leading Edge DB table 214 (FIG. 5*b*) shows the gains of the first three and the last two delays during the Leading Edge portion of the reverberation attenuation curve. The shape of this decay vs. delay number again may be specified by the designer. A linear delay is usable. To place more emphasis on the first few delays, in one embodiment a half sine wave shape is employed. The full range of the Leading Edge DB control 10*f* is from 40 DB overshoot to 40 DB undershoot.

During the Flat Time portion which extends from delay 43 to delay 81 in the present example, the gain is 1.00 for each delay (or such other constant gain less than unity as may be specified). Between delay 81 and delay 223 in the present example, the gain decreases gradually by the gain established by the Decay DB control 10*g*, from 0 DB to −48.6 DB, as shown in the Decay DB table 216 (FIG. 5*b*). If the gain decreases linearly, that is −0.34 DB at each successive delay, the midpoint delay number 152 has a gain of −24.3 DB, which is half the maximum attenuation.

To produce a desired reverberation effect, the shape of the decay portion of the reverberation attenuation curve can be modified from a straight line to a convex or a concave curve (or another desired curve) (FIG. 6) using the Decay Linearity control 10*h* (FIG. 5*b*). The results of setting the control below linear in this example to produce a concave decay are shown in the Decay Linearity table 218 (FIG. 5*b*). As depicted in FIGS. 5*b* and 6, the DB change between successive delays has increased at the beginning of the decay period and decreased at the end of the decay period. The midpoint delay 152 now has a reduced gain of −30.4 DB. The listening effect is an increase in longer-term reverberation and a decrease in shorter-term reverberation.

The gain versus delay number for the exemplary control settings is depicted in the DB vs Delay table 220, and exemplary polarity assignments for each delay are specified in the polarities table 222 (FIG. 5*b*). The basis for selection of polarities for the respective delays is subsequently discussed in greater detail.

The output of the DB vs Delay table 220 is a set of coefficients sent to the tapped delay line 106 (FIG. 1) and requires conversion to sample number and gain with an assigned polarity. A list of polarities in the Polarities table 222 defines the polarity for each sample. Typically for low density reverberation as in FIG. 5*b* the first 25% or so of the delays are assigned alternating polarity and the remaining 75% are assigned positive polarities the same as the direct signal. Reversing a few polarities may be necessary for a particular setup to avoid prominent peaks in the frequency response and to provide a fairly uniform comb filter.

The list of exemplary gain value pairs shown in the output block 224 (FIG. 5*b*), in one embodiment, are specified to produce a series of time delayed versions of the input signal having greater gain at high frequencies (i.e. >2 kilohertz) than at low frequencies (i.e. <200 hertz) with respect to the gain of the input signal as set by equalizers 102 and 104 (FIG. 3). Such a relationship between the frequency response of the reverberation waveform signal with respect to the frequency response of the input signal has been observed to produce generally desirable reverberation characteristics for certain music sources.

The Output Block 224 includes the sample identifier and the gain coefficient for each gain value pair in the list. For simplicity of illustration only the beginning and ending sample numbers for each portion are shown along with the applicable gain for each gain value pair. The decay section also shows the gain at the midpoint sample.

The adjustment of the controls results in the generation of the various tables. The entries in the respective tables are used at runtime to provide the gain constants that are associated with specific sample numbers.

Adding the intermediate values as previously described, can generate too large a reverberation waveform signal relative to the direct signal. Accordingly, attenuation is necessary. The Wet gain control 14$a$ (FIG. 4) is associated with the output block 224 (FIG. 5$b$) and provides the necessary attenuation. This control may also provide the scalar employed in the summer 110 to provide desired attenuation. It is normally set by adjusting the control while listening. Each slider control has an effect on the reverberation loudness as well as its character. Slider controls may have associated empirically developed gain corrections for each of the 8 sliders so the slider settings have a much smaller effect on gain. When adjustments are applied to the individual slider controls the wet gain in the Output block 224 is modified accordingly. Nevertheless, careful adjustment of reverberation gain by the listener is required for each piece of music because the balance of reverberation vs. direct signal is critical to within 0.5 DB. Gain adjustment does not have to done at the output block 224. It can be performed equally well on the input signal to the reverberation system.

When used in a high density (cascaded) configuration there are two nearly identical Output blocks 224, one delivering coefficients to Delay Line 106.1 and the other delivering coefficients to Delay Line 106.2 (FIG. 3). As subsequently discussed, the list in the first output block has alternating gain polarities and the list in the second output block has all positive polarities. Together, the differentiating effect of the first output block and the integrating effect of the second output block produce a fairly uniform comb filtering output with the number of delays squared. This does not eliminate the need for equalization but reduces the amount of equalization that is needed.

The controls provided to a user may control multiple channels or individual channels. For example, one set of controls may specify the reverberation characteristics for the front center channel, and another set of controls may specify the reverberation characteristics for the front left and right channels. Additionally, upon user selection, the same controls employed for the front left and right channels may also be employed for the front center channel. Furthermore, another set of controls may be provided for the rear left and right channels and upon user selection, the same controls may also be employed for the side left and right channels or a separate set may be used.

Reverberation Attenuation Curve

Comb filtering occurs when a delayed version of the direct signal is added to the direct signal. For a sine wave input the phase shift of the delayed signal is proportional to both its delay and its frequency. As the frequency increases its phase cycles from in-phase with the direct signal to out-of-phase, the sum resulting in alternating peaks and valleys in the frequency response.

A problem resulting from a short initial delay and high density of reflections at the beginning is unpleasant sounding, large, slow variations in the comb filtering frequency response due to the vector addition of the direct signal and all of the reflections (delays). Three methods are disclosed for effectively tuning out these variations through control of the polarities of the individual delays. Other factors that affect the tuning are the shape of the reverberation decay with time and the total number of delays.

If the polarities of the delays are all positive as specified in the polarities table 222 (meaning in-phase with the direct signal) the effect is like integration of the signal. The frequency response declines toward the high frequencies similar to an integrator. This makes the sound very heavy in the bass. If the polarities alternate so that half of the delays are positive and half are negative, the effect is like differentiation of the signal. The frequency response increases toward the high frequencies similar to a differentiator, making the sound very thin. In each case the detailed frequency response is not a straight line; it has ripples due to comb filtering.

Figure 7:
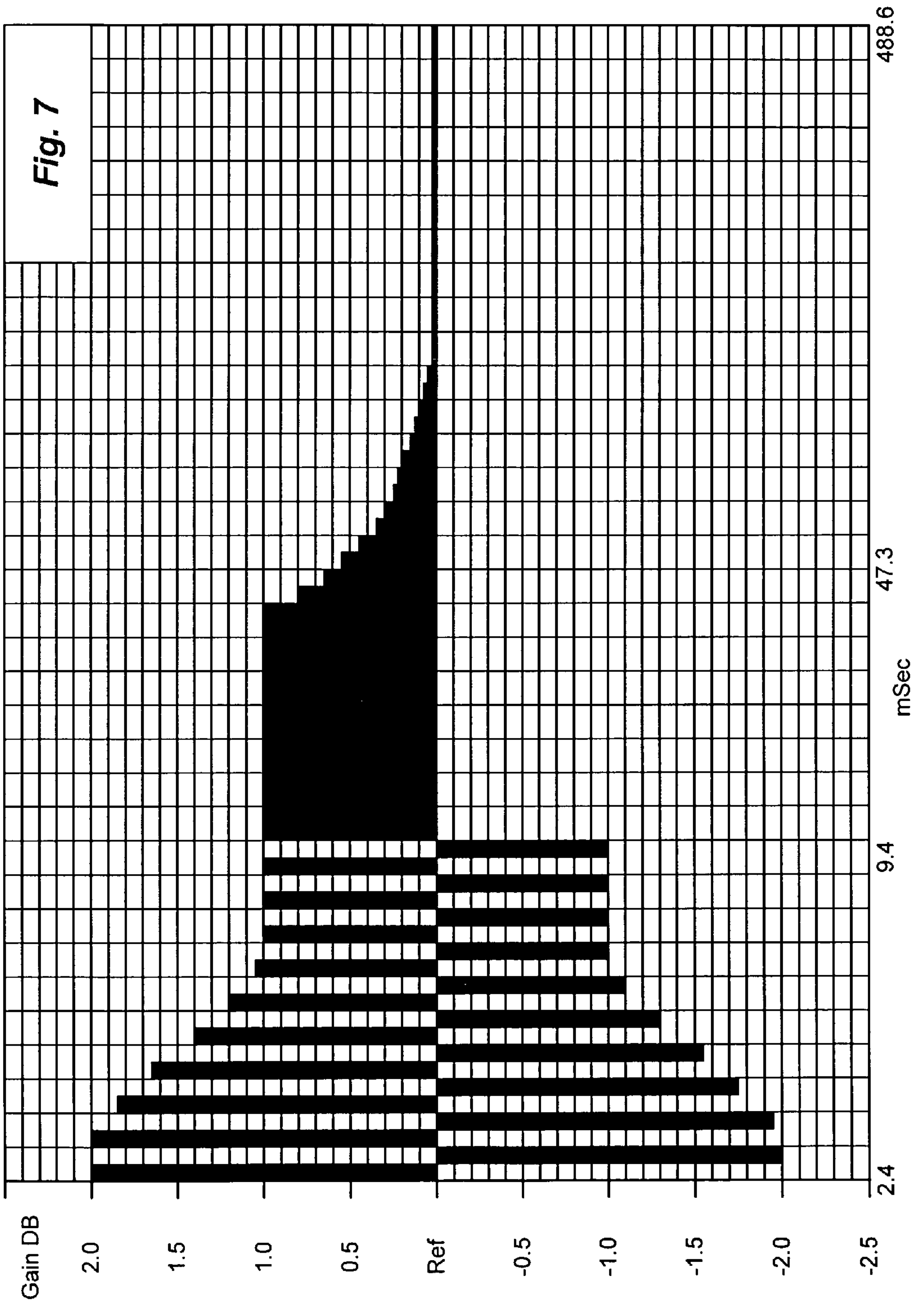
FIG. 7 is an exemplary graph depicting gain versus time for settings in a system operative in accordance with the present invention.

Combining these two effects by making the first approximately 25% of the delays alternate in polarity and the remainder all positive, produces reverberation having both bass boost and treble boost. Such a polarity configuration is depicted in FIG. 7. When added in a suitable amount to the direct signal the effect makes pleasant sounding reverberation. Adding separate tone control equalization to the reverberation and to the direct signal further refines the sound.

The second method of effectively tuning out major variations in the comb filtering frequency response is to use two cascaded reverberation generators, one having alternating polarities and the other having a single polarity. Cascaded reverberation generators, known in the art, have the advantage of effectively multiplying the number of delays in all of the generators by one another to obtain high densities at long delays. Using one generator having rising frequency response feeding another having declining frequency response makes a high-density system with a fairly level comb filter response. Combined with small amounts of equalization, this system works well over a wide range of reverberation from short to long.

The third method of tuning out major variations in the comb filtering frequency response is to individually choose the polarities of each delay. This can be facilitated, for example, by using a computer screen containing several hundred check boxes. Polarities can be adjusted while listening to pink noise (it has the same noise power in each octave) and tuning out audible peaks. Other ways are to measure the average gains using ⅓ octave noise bands or spectrum analysis. Selecting many polarities is time consuming. It has the further disadvantage that the resulting fairly random order of polarity reversals produces audible noise when listening to pure low frequency tones that become modulated. Therefore, this method is best used to fine-tune either of the first two methods. Sometimes it requires only one or two polarity reversals to reduce minor peaks remaining from either method.

In prior artificial reverberation systems, two reasons for avoiding short initial delays, besides simulating real reverberation, were peaky average frequency response and loss of clarity when reproducing percussive transients. When the high frequency reverberation exceeds the direct signal, there is an opportunity to enhance percussive transients by shaping the amplitude decay vs. time. If the first few milliseconds of delays have several DB greater gain than subsequent delays (overshoot), the effect is similar to a leading edge volume expander which can give percussive transients more impact. Furthermore, the first 50 milliseconds or so of high frequency reverberation has the effect of stretching transients in time, making them more audible.

Another benefit of shaping the decay curve is the ability to obtain intimate sound together with the warmth of long reverberation lasting 1 second or more. For a singer this is akin to singing in a shower, in a medium sized room, and in a large concert hall, all at once. By providing a region of constant or near constant delay gain within the first 100 milliseconds the clarity of a small space is achieved.

In principle, reverberation for three different room sizes can be achieved simultaneously by using three different reverberation systems connected to the same input with their outputs added together. The presently disclosed system eliminates this complexity by shaping the decay curve. It works particularly well when the extreme high frequency content of the reverberation effectively replaces the high frequency content of the direct signal via equalization of each signal. With the right shape continuously variable room size is achievable.

The waveform charts depicted in FIGS. 7, 8, 9, and 10 clarify the earlier descriptions. FIG. 7 shows the typical amplitude and polarity of each delay vs. time for an exemplary single delay line system such as shown in FIGS. 5*a*-5*b*. Notice that the time scale is similar to, but not exactly logarithmic. The choice of the time scale allows the individual delays to appear at first glance equally spaced apart. However, referred to actual time, the spacing of the delays continually increases over a 350 to 1 range, from 50 microseconds to 17.5 milliseconds. For purposes of illustration the number of delays shown is near the minimum usable for a 488.6 millisecond reverberation waveform.

A delay line at least 488.6 milliseconds long in the present illustrative example, produces all of the delay line positions. The height of each vertical line represents the gain coefficient of a particular delay, either positive or negative. The time delayed waveform samples can all be summed to produce the reverberation waveform signal. If the width of each vertical line were near zero, FIG. 7 would represent the impulse response of the Tapped Delay Line.

The vector addition of all of the taps at the output of the tapped delay line 806 produces comb filtering and, in the case of FIG. 7, bass and treble boost. The system total frequency response is further modified by the gains and phase shifts of the two equalizers and the vector additions in the summer 808. What happens at the total output when the equalizers are set so the system sounds balanced, is gradual replacement of the direct signal by reverberation above 2 kHz. Below 300 Hz the reverberation may be 12 DB or more below the direct signal to prevent muddy bass. The average frequency response may deviate from flat by only a few DB while the detailed response has wiggles due to comb filtering.

In FIG. 7 the first approximately 25% of the delays show alternating polarity. The remaining delays are all positive. As explained earlier, alternating delays tend to differentiate the signal, causing rising high frequency response. Delays having the same polarity tend to integrate the signal, causing rising low frequency response. The combined effect is bass and treble boost and a dip at middle frequencies near 500 Hz. The system vector addition and frequency response is further affected by the shape of the decay from 2.4 milliseconds to 488.6 milliseconds, by the choice of the short 2.4 millisecond initial delay, and by phase shifts in the equalizers.

The decay curve depicted in FIG. 7 has three regions: overshoot which lasts only 5 milliseconds, constant gain between 5 and 42 milliseconds, and decay from 42 milliseconds to 488.6 milliseconds. The overshoot region enhances percussive transients. The constant gain region smoothes high frequencies without creating a hollow sound. The decay region adds the warmth of a small room.

Note that in the illustrated example, approximately 25% of the delays that have alternating polarities occur within 7.4 milliseconds following the 2.4 millisecond initial delay, unlike real or prior artificial reverberation. These delays start closely spaced at 50 microseconds in the chart, but typically at 30 microseconds in the actual system. This is what is missing in nature and necessary for really clean, smooth sounding high frequencies without loss of detail.

FIG. 7 represents the first method of tuning out unwanted peaks in the average frequency response. The combination of reverberation waveform samples having alternating polarities followed by all positive polarities produces a comb filter frequency response whose average can be suitably balanced by the equalizers over a large range of maximum and minimum delays. For combinations that cannot be completely compensated by the equalizers, small changes in shape of the decay curve, the total number of delays, and the initial and maximum delays will generally enable a pleasing result. In a small number of combinations the final tuning can be aided by changing the polarities of a few delays.

For longer reverberation with a much higher density of delays the single reverberation waveform sample generator depicted in FIG. 1 can be replaced by the first and second reverberation waveform sample generators 107.1 and 107.2 (FIG. 3).

Figure 8:
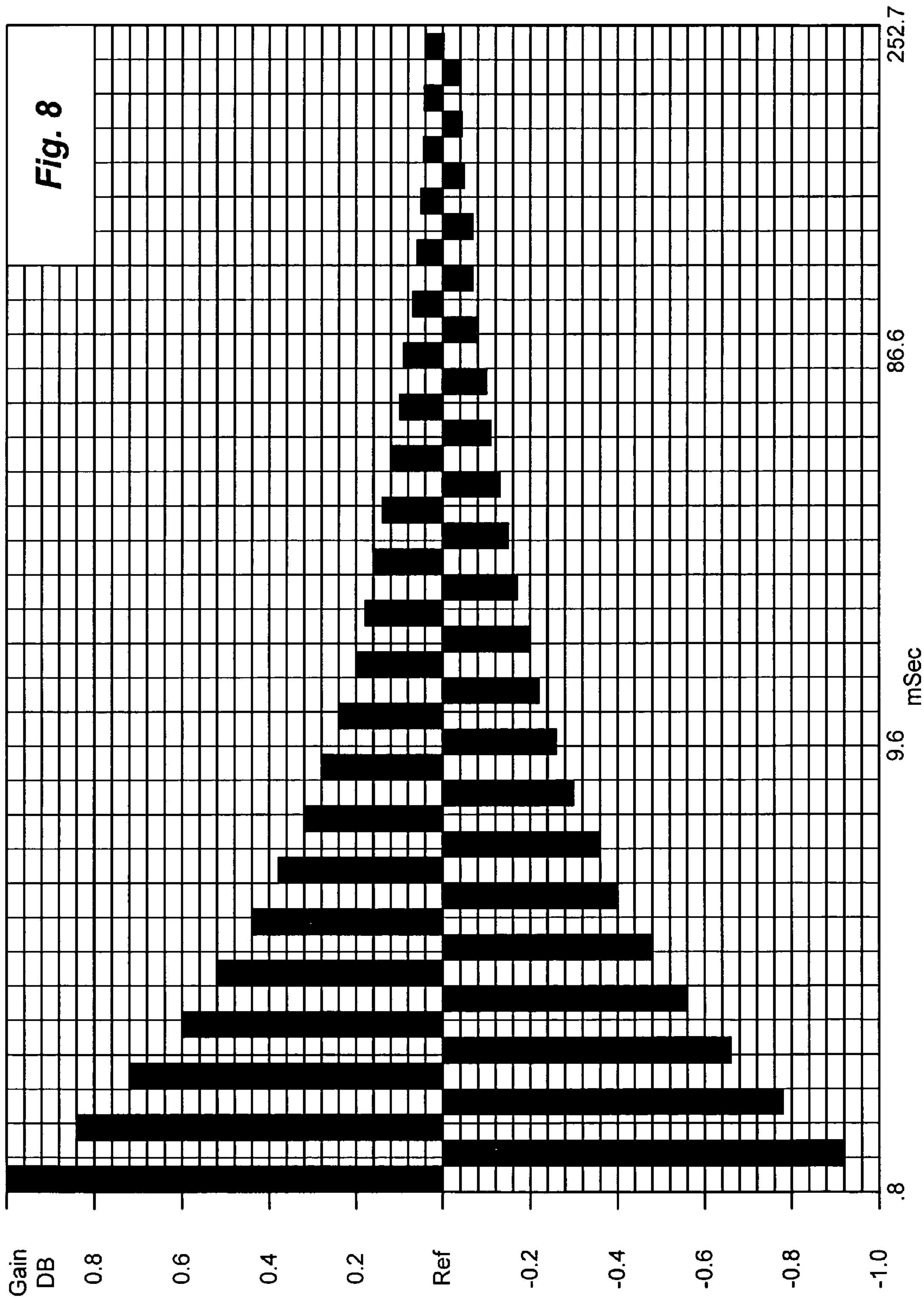
FIG. 8 is an another exemplary graph depicting gain versus time for settings in a system operative in accordance with the present invention.

FIG. 8 shows a graph of gain value pairs of alternating polarity representing the attenuation curve used by the first reverberation generator 107.1 (FIG. 3).

Figure 9:
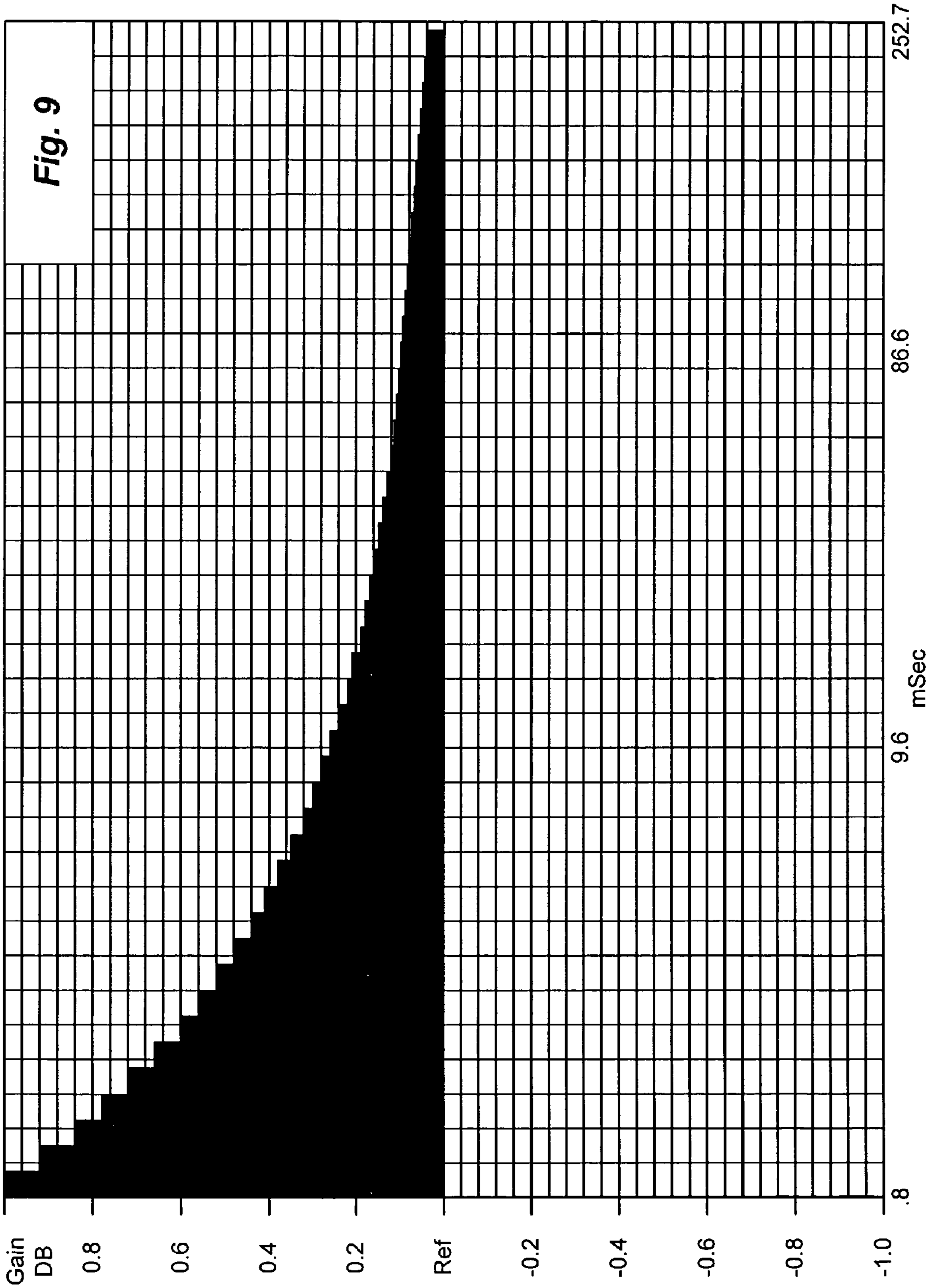
FIG. 9 is an exemplary graph depicting gain versus time for the delay line output from a second of two delay lines in a reverberation system employing cascaded delay lines.

FIG. 9 shows all positive gain value pairs representing an exemplary list of gain value pairs used by the second reverberation waveform sample generator 107.2 (FIG. 3). As the first waveform sample generator generates first current waveform samples, such samples are input to the second reverberation waveform sample generator 107.2 (FIG. 3). The effect is to square the number of pulses in the impulse response of the second series of reverberation waveform samples if the lists of gain value pairs used to generate the first and second current reverberation waveform samples are the same. The differentiating effect of the alternating polarities in the list of gain value pairs used by the first reverberation waveform generator 107.1 followed by the integrating effect of the positive polarities in the second list of gain value pairs used by the second reverberation waveform sample generator 107.2 reduces but does not eliminate the need for equalization. Note that when two cascaded reverberation generators 107.1 and 107.2 are used, assuming the same controls are employed to generate the lists of gain value pairs, the total initial and maximum delays are doubled.

In each of FIGS. 8 and 9 the amplitudes decay continuously without overshoot and constant gain regions. This type of curve can produce clear sound if there is a fast enough decay during the first 100 milliseconds. Otherwise at least some overshoot is desirable.

Figure 10:
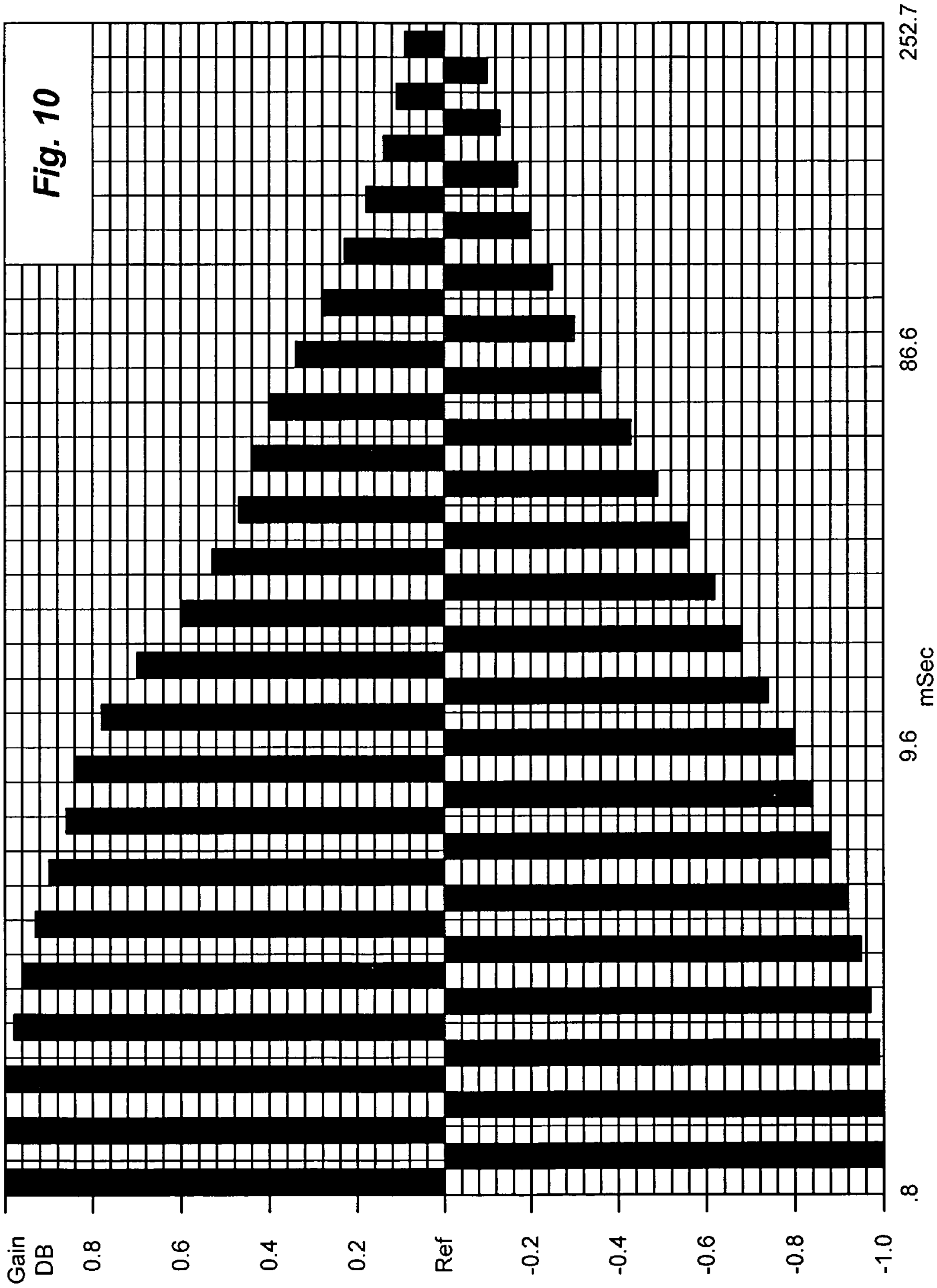
FIG. 10 is an exemplary graph depicting gain versus time for the delay line output from a first of two delay lines in a reverberation system employing cascaded delay lines.

FIG. 10 shows a much slower rate of decay in the first 50 milliseconds. This type of curve is useful for adding deliberately hollow sound to vocals. To enhance clarity it is preferable to add some overshoot.

Correlation

In a real room the reverberation in the left channel is different from that in the right channel because of natural asymmetry in reflecting surfaces. The left and right reverberation components are uncorrelated. The audible effect of decorrelation is widening of the acoustic image. The system herein described produces correlated reverberation if the Time Scale Tables for all the channels are the same, resulting in an image matching the direct signal. For some music, a degree of de-correlation is more pleasing. In one embodiment of this system, additional slider controls (not shown) scale all of the delay times of the channel Time Scale Tables so that they differ from one another by controllable amounts, producing controllable de-correlation. For example, for slight de-correlation that produces a slightly wider stereo image, the left channel times may be multiplied by 1.005 while the right channel times may be multiplied by 0.995. For a very high degree of de-correlation the left channel times might be multiplied by 1.1 while the right channel times are multiplied by 0.90. Similar controls can produce time differences among front, rear, and side channels in various combinations for effective control of the shape of the acoustic space perceived by the listener.

The above-described digital processing functions may be performed via use of a programmed computer executing instructions out of a memory, in a hardware controller operative to execute the functions herein described, or in a combination of hardware and software. Moreover, the operations performed by the computational components and summer may be performed by single component such as a pre-programmed processor, a DSP or any other suitable hardware or software component alone or in combination.

Having described a system and method for providing improved reverberation, it will be appreciated by those of ordinary skill in the art that modifications to and variations of the above-described system and method may be made without departing from the inventive concepts disclosed herein. Accordingly, the invention should not be viewed as limited, except by the scope and spirit of the appended claims.

What is claimed is:

1. A system for electronically generating an artificial reverberation waveform from an input waveform including a series of digital samples having associated input sample amplitudes, said system comprising:

an equalizer for receiving said input waveform samples and being operative to provide a gradually rising frequency response such that the equalizer can apply a gradually increasing gain at frequencies from below 200 hertz to above 2 kilohertz relative to the input waveform to produce a first waveform including first waveform samples with first waveform sample amplitudes;

a first digital delay line operative to receive and store the first waveform samples with the first waveform sample amplitudes, said first delay line having a plurality of delay line positions;

at least one memory containing a first list of gain value pairs, each one of said gain value pairs including a first value associated with one of said delay line positions and a second value corresponding to a gain value, wherein the gain value pairs include first, second and third groups of gain value pairs, wherein the first values within said first group are less than the first values in said second group and the first values within said second group are less than the first values within said third group, wherein the magnitudes of said second values within said second group are generally equal to a reference value, the magnitudes of said second values within said first group are greater than the magnitude of said reference value and are defined by a predetermined function representing a reverberation attenuation curve for the first group, and the magnitudes of said second values within said third group are less than said reference value; and a first computational component for producing said artificial reverberation waveform, said artificial reverberation waveform including a first series of first current reverberation samples having associated amplitudes, said first computational component operative to calculate an amplitude of each first current reverberation sample by:

identifying, using said first values within said first list of gain value pairs, specific ones of said first delay line positions, for each identified first delay line position, generating a first intermediate value as a function of the amplitude contained in the respective first delay line position and the second value associated with the first value identifying the respective first delay line position, and summing said first intermediate values to obtain the respective first current reverberation sample amplitude.

2. The system of claim 1 further including a summer operative to sum a scaled amplitude of each first current reverberation sample with a scaled amplitude of the current input waveform sample to produce first composite waveform samples having first composite waveform sample amplitudes.

3. The system of claim 1 wherein said first computational component is operative to calculate said first current reverberation waveform sample amplitudes periodically at a rate equal to a received input sample rate.

4. The system of claim 1 wherein the time delay between a current sample of said input waveform and the most recently received input sample within said digital delay line that is employed to generate one of said first intermediate values is less than or equal to 15 milliseconds.

5. The system of claim 1 wherein said first computational component is further operative to add a specified offset value to values employed to generate said first values of each gain value pair.

6. The system of claim 1 wherein said first computational component is operative to generate each first intermediate value by multiplying the amplitude contained in the respective first delay line position by the second value associated with the first value used to identify the respective delay line position.

7. The system of claim 1 wherein at least some of the consecutive gain value pairs in said first list of gain value pairs have second values of the same polarity and at least some of the consecutive gain value pairs in said first list of gain value pairs have second values of alternating polarity.

8. The system of claim 1 wherein said first computational component is operative to generate said second values of said gain value pairs by at least one of:

selecting said values from at least one table;

generating said values employing at least one formula;

generating said values from data representative of a graph; and generating said values from a measurement.

9. The system of claim 1 wherein said first computational component comprises a processor executing instructions out of said at least one memory.

10. The system of claim 1 further including:

a first user settable control for specifying the number of gain value pairs;

a second user settable control for specifying the maximum time delay value within said second group of gain value pairs; and a third user settable control for specifying the time interval between the first and last time delay values within said first group of gain value pairs.

11. The system of claim 1 wherein said memory includes a plurality of accessible lists of gain value pairs, said system further including a selector for selecting by a user one of said accessible lists to be used as said first list of gain value pairs.

12. The system of claim 1 further including:

a second digital delay line in communication with said first computational component and receiving said first series of reverberation waveform samples, said second digital delay line having a plurality of delay line positions;

said at least one memory containing a second list of gain value pairs, each one of said gain value pairs in said second list including a first value associated with one of said second delay line positions and a second value corresponding to a gain value, wherein the gain value pairs include first, second and third groups of gain value pairs, wherein the first values within said first group are less than the first values in said second group and the first values within said second group are less than the first values within said third group, wherein the magnitudes of said second values within said second group are generally equal to a reference value, the magnitudes of said second values within said first group are greater than the magnitude of said reference value, and the magnitudes of said second values within said third group are less than said reference value;

a second computational component for producing a second series of second reverberation samples having associated amplitudes, said second computational component operative to calculate each second current reverberation sample amplitude by:

identifying, using said first values within said second list of gain value pairs, specific ones of said second delay line positions, for each identified second delay line position, generating a second intermediate value as a function of the amplitude contained in the respective second delay line position and the second value associated with the first value identifying the respective second delay line position, and summing said second intermediate values to obtain the respective second current reverberation sample amplitude.

13. The system of claim 12 further including a summer operative to produce a series of composite waveform sample amplitudes by summing a scaled current input sample amplitude with a scaled second current reverberation sample amplitude.

14. The system of claim 12 wherein the magnitude of the second values within corresponding entries in the first and second lists of gain value pairs are the same.

15. The system of claim 12 wherein said first and second computational components comprise the same computational component.

16. The system of claim 12 wherein at least some consecutive gain value pairs in said second list of gain value pairs have second values of the same polarity and at least some consecutive gain value pairs in said first list of gain value pairs have second values of alternating polarity.

17. The system of claim 12 wherein all or almost all of the second values in one of said first and second lists of gain value pairs are of the same polarity and all or almost all of the second values in the other one of said first and second lists of gain value pairs are of alternating polarity.

18. A system for electronically generating an artificial reverberation waveform from an input waveform including a series of digital samples having associated input sample amplitudes, said system comprising:

a first digital delay line operative to receive and store said input samples, said first delay line having a plurality of delay line positions;

at least one memory containing a first list of gain value pairs, each one of said gain value pairs including a first value associated with a selected one of said first delay line positions and a second value corresponding to a gain value;

a first computational component for producing said artificial reverberation waveform, said artificial reverberation waveform including a first series of first current reverberation samples having associated amplitudes, said first computational component operative to calculate an amplitude of each first current reverberation sample by:

identifying, using said first values within said first list of gain value pairs, specific ones of said first delay line positions, for each identified first delay line position, generating a first intermediate value as a function of the amplitude contained in the respective first delay line position and the second value associated with the first value identifying the respective first delay line position, wherein at least one delay line position containing an input sample employed to generate an intermediate value is delayed from the then current digital sample of the input waveform by no more than 15 milliseconds, and summing said first intermediate sample values to obtain the respective first current reverberation sample amplitude, wherein at least one first current reverberation sample amplitude is greater than an associated input sample amplitude; and a summer operative to sum a scaled amplitude of each first current reverberation sample with a scaled amplitude of each current input waveform sample to produce first composite waveform samples having first composite waveform sample amplitudes.

19. The system of claim 18 wherein said first computational component is operative to calculate said current reverberation waveform sample amplitudes periodically at a rate equal to a received input sample rate.

20. The system of claim 18 wherein said first computational component is further operative to add a specified offset value to values employed to generate said first values of each gain value pair.

21. The system of claim 18 wherein said first computational component is operative to generate said first intermediate value by multiplying the amplitude contained in the respective first delay line position by the second value associated with the first value used to identify the respective delay line position.

22. The system of claim 18 wherein at least some of the consecutive gain value pairs in said first list of gain value pairs have second values of the same polarity and at least some of the consecutive gain value pairs in said first list of gain value pairs have second values of alternating polarity.

23. The system of claim 18 wherein said first computational component is operative to generate said second values of said gain value pairs by at least one of:

selecting said values from at least one table;

generating said values employing at least one formula;

generating said values from data representative of a graph; and generating said values from a measurement.

24. The system of claim 18 wherein said first computational component comprises a processor executing instructions out of said at least one memory.

25. The system of claim 18 wherein said memory includes a plurality of accessible lists of gain value pairs, said system further including a selector for selecting by a user one of said accessible lists of gain value pairs as said first list of gain value pairs.

26. The system of claim 18 further including:

an equalizer interposed between a source of said input waveform samples and said first delay line, said equalizer operative to produce an input signal to the first delay line of increased high frequency gain to produce a first reverberation waveform having a higher gain at frequencies above 2 kilohertz than at frequencies below 200 hertz relative to the input waveform.

27. The system of claim 18 further including:

a second digital delay line in communication with said first computational component and receiving said first series of reverberation waveform samples, said second digital delay line having a plurality of delay line positions;

said at least one memory containing a second list of gain value pairs, each one of said gain value pairs in said second list including a first value associated with a selected one of said second delay line positions and a second value corresponding to a gain value;

a second computational component for producing a second series of reverberation sample amplitudes, said second computational component operative to calculate each second current reverberation sample amplitude by:

identifying, using said first values within said second list of gain value pairs, specific ones of said second delay line positions, for each identified second delay line position, generating a second intermediate value as a function of the amplitude contained in the respective second delay line position and the second value associated with the first value identifying the respective second delay line position, and summing said second intermediate values to obtain the respective second current reverberation sample amplitude.

28. The system of claim 27 further including a summer operative to sum a scaled amplitude of each first current reverberation sample with a scaled amplitude of the current input waveform sample to produce first composite waveform samples having first composite waveform sample amplitudes.

29. The system of claim 27 wherein the magnitude of the second values within corresponding entries in the first and second lists of gain value pairs are the same.

30. The system of claim 27 wherein said first and second computational components are embodied in a single computational component.

31. The system of claim 27 wherein at least some of the consecutive gain value pairs in said second list of gain value pairs have second values of the same polarity and at least some of the consecutive gain value pairs in said second list of gain value pairs have second values of alternating polarity.

32. The system of claim 27 wherein all or almost all of the second values in one of said lists of gain value pairs are of the same polarity and all or almost all of the second values in the other one of said lists of gain value pairs are of alternating polarity.

33. A system for electronically generating an artificial reverberation waveform from an input waveform including a series of digital samples having associated input sample amplitudes, said system comprising:

a first digital delay line operative to receive and store successive input samples having said input sample amplitudes, said first delay line having a plurality of first delay line positions;

at least one memory containing first and second lists of gain value pairs, each one of said gain value pairs including a first value associated with a selected one of said first delay line positions and a second value corresponding to a gain value, at least some consecutive gain value pairs in one of said first and second lists containing second values of alternating polarity and all or almost all of the gain value pairs in the other one of said first and second lists include second values of the same polarity; and a first computational component for producing a first series of first current reverberation samples having associated amplitudes, said first computational component operative to calculate the amplitude of each first current reverberation sample by:

identifying, using said first values within said first list of gain value pairs, specific ones of said first delay line positions, for each identified first delay line position, generating a first intermediate value as a function of the amplitude contained in the respective first delay line position and the second value associated with the first value identifying the respective delay line position, and summing said first intermediate values to obtain the respective amplitude of each first current reverberation sample;

a second digital delay line operative to receive and store said first current reverberation samples, a second computational component for producing a second series of second current reverberation samples having associated sample amplitudes, said second computational component operative to calculate each second current reverberation sample amplitude by:

identifying, using said first values within said second list of gain value pairs, specific ones of said second delay line entries, for each identified second delay line position, generating a second intermediate value as a function of the amplitude contained in the respective first delay line position and the second value associated with the first value identifying the respective second delay line position, and summing said second intermediate values to obtain the respective second current reverberation sample amplitude.

34. The system of claim 33 further including a summer operative to sum a scaled amplitude of each second current reverberation sample with a scaled amplitude of each current input waveform sample to produce first composite waveform samples having first composite waveform sample amplitudes.

35. The system of claim 33 wherein said first and second computational components are operative to calculate respective first and second current reverberation waveform samples having associated first and second current reverberation sample amplitudes respectively, periodically at a rate equal to a received input sample rate.

36. The system of claim 33 wherein said first and second computational components are operative to generate respective first and second intermediate values by multiplying the amplitude contained in the respective first and second delay line positions by the respective second values associated with the first values identifying the respective delay line positions in the respective gain value pairs.

37. The system of claim 33 wherein at least some of the consecutive gain value pairs in said first list of gain value pairs have second values of the same polarity and at least some of the consecutive gain value pairs in said first list of gain value pairs have second values of alternating polarity.

38. The system of claim 33 wherein said first and second computational components are operative to generate said second values of said gain value pairs by at least one of:

selecting said values from at least one table;

generating said values employing at least one formula;

generating said values from data representative of a graph; and generating said values from a measurement.

39. The system of claim 33 wherein said first and second computational components comprise at least one processor executing instructions out of said at least one memory.

40. The system of claim 33 wherein said memory includes a plurality of accessible sets of gain value pairs, each set including a first list of gain value pairs and a second list of gain value pairs, said system further including a selector for selecting by a user one of said sets of gain value pairs to be used by said system.

41. The system of claim 33 further including:

an equalizer interposed between a source of said input waveform samples and said first delay line, said equalizer operative to produce an input signal to the first delay line of increased high frequency gain to produce a second reverberation waveform having a higher gain at frequencies above 2 kilohertz than at frequencies below 200 hertz relative to the input waveform.

42. The system of claim 33 wherein the first and second lists each have the same number of gain value pairs and the magnitude of the second values within corresponding entries in the first and second lists of gain value pairs are the same.

43. The system of claim 33 wherein said first and second computational components are embodied in a single computational component.

44. The system of claim 33 wherein all or almost all of the second values in one of said first and second lists of gain value pairs are of the same polarity and all or almost all of the second values in the other one of said first and second lists of gain value pairs are of alternating polarity.

45. A method for generating an artificial reverberation waveform from an input waveform including a series of digital input samples having associated input sample amplitudes, said method comprising:

amplifying the input waveform with a gradually increasing frequency response to provide a gradually increasing gain at frequencies from below 200 hertz to above 2 kilohertz relative to the input waveform to produce a first waveform that includes first waveform samples with first sample amplitudes;

sequentially storing the first waveform samples in a digital delay line having a plurality of delay line positions;

providing a list of gain values, each one of said gain values being associated with one of said plurality of delay line positions, wherein the gain values include first, second and third groups of gain values and wherein the magnitudes of said gain values within said second group are generally equal to a reference value, the magnitudes of said gain values within said first group are greater than the magnitude of said reference value, and the magnitudes of said gain values within said third group are less than said reference value; and generating the artificial reverberation waveform including a series of current reverberation samples having associated amplitudes, each current reverberation sample calculated by:

identifying specific delay line positions associated with said gain values in said list of gain values, for each identified delay line position, generating an intermediate value by multiplying the amplitude contained in the respective delay line position by the gain value associated with the respective delay line position, and summing said first intermediate values to obtain the amplitude of the respective current reverberation sample amplitude; and generating a composite output waveform by summing the current reverberation samples with the current input samples.

46. A method for generating an artificial reverberation waveform from an input waveform including a series of digital samples having associated input sample amplitudes, said method comprising:

sequentially storing input samples having respective input sample amplitudes in a first digital delay line having a plurality of delay line positions;

generating the artificial reverberation waveform including a series of current reverberation samples having associated amplitudes, each current reverberation sample calculated by:

identifying specific delay line positions associated with said gain values in said list of gain values, multiplying each input sample amplitude stored in an identified one of said delay line positions by the gain value associated with the respective delay line position to generate a plurality of intermediate values, wherein at least one selected delay line position containing an input sample that is employed to generate the corresponding intermediate value is delayed from the then current digital sample of the input waveform by no more than 15 milliseconds;

summing said intermediate values to obtain the respective first current reverberation sample amplitude, wherein at least one first current reverberation sample amplitude is greater than an associated input sample amplitude; and generating a composite output waveform by summing the current reverberation samples with the current input samples, wherein at least the current reverberation samples or the current input samples are scaled prior to summing of each current input sample with a corresponding current reverberation sample.

47. A method for generating an artificial reverberation waveform from an input waveform including a series of digital samples having associated input sample amplitudes, said method comprising:

sequentially storing input samples having input sample amplitudes in a digital delay line having a plurality of delay line positions;

providing a list of gain values, each one of said gain values being associated with a selected one of said delay line positions, at least five logically adjacent gain values in said list containing gain values of alternating polarity and at least some logically adjacent gain values in said list containing gain values of the same polarity;

generating said artificial reverberation waveform by producing a series of current reverberation samples having associated amplitudes, each current reverberation sample calculated by:

identifying specific ones of said delay line positions associated with said gain values in said list of gain values, for each identified delay line position, generating an intermediate value by multiplying the amplitude contained in the respective delay line position by the gain value associated with the respective delay line position, and summing said intermediate values to obtain the current reverberation sample amplitude; and generating a composite output waveform by summing the current reverberation samples with the current input samples.

48. A method for electronically generating an artificial reverberation waveform from an input waveform including a series of digital samples having associated input sample amplitudes, said method comprising:

providing a first digital delay line to receive and store successive input samples having said input sample amplitudes, said first delay line having a plurality of first delay line positions;

providing at least one memory containing first and second lists of gain value pairs, each one of said gain value pairs including a first value associated with a selected one of said first delay line positions and a second value corresponding to a gain value, at least some consecutive gain value pairs in one of said first and second lists containing second values of alternating polarity and all or almost all of the gain value pairs in the other one of said first and second lists include second values of the same polarity; and providing a first computational component for producing a first series of first current reverberation samples having associated amplitudes, said first computational component operative to calculate the amplitude of each first current reverberation sample by:

identifying, using said first values within said first list of gain value pairs, specific ones of said first delay line positions, for each identified first delay line position, generating a first intermediate value as a function of the amplitude contained in the respective first delay line position and the second value associated with the first value identifying the respective delay line position, and summing said first intermediate values to obtain the respective amplitude of each first current reverberation sample;

providing a second digital delay line operative to receive and store said first current reverberation samples;

providing a second computational component for producing a second series of second current reverberation samples having associated sample amplitudes, said second computational component operative to calculate each second current reverberation sample amplitude by:

identifying, using said first values within said second list of gain value pairs, specific ones of said second delay line entries, for each identified second delay line position, generating a second intermediate value as a function of the amplitude contained in the respective first delay line position and the second value associated with the first value identifying the respective second delay line position; and summing said second intermediate values to obtain the respective second current reverberation sample amplitude.

* * * * *

UNITED STATES PATENT AND TRADEMARK OFFICE

CERTIFICATE OF CORRECTION

PATENT NO. : 8,041,045 B2
APPLICATION NO. : 11/255893
DATED : October 18, 2011
INVENTOR(S) : Richard S. Burwen It is certified that error appears in the above-identified patent and that said Letters Patent is hereby corrected as shown below:

Title Page, Item (57) Abstract, line 2, "delays" should read --delay--;

Page 6, Fig. 5a, in Fewer Delays table 212, under the heading "Time" in the right hand column, "(mSec)" should read --(Samples)--;

Column 4, line 46, "FIG. 1 Refer-" should read --FIG. 1. Refer- --;

Column 6, line 22, "al" should read --$a_1$--;

Column 15, line 24, "to done" should read --to be done--; and

Column 24, line 27, "first delay" should read --second delay--.

Signed and Sealed this
Twenty-eighth Day of February, 2012

David J. Kappos
*Director of the United States Patent and Trademark Office*